United States Patent
Gabrys et al.

(10) Patent No.: US 10,043,311 B2
(45) Date of Patent: *Aug. 7, 2018

(54) IMMERSIVE DESIGN MANAGEMENT SYSTEM

(71) Applicant: The Boeing Company, Chicago, IL (US)

(72) Inventors: Jonathan Wayne Gabrys, Downingtown, PA (US); David William Bowen, Deptford, NJ (US); Anthony Mathew Montalbano, Folsom, PA (US); Chong Choi, Media, PA (US)

(73) Assignee: The Boeing Company, Chicago, IL (US)

( * ) Notice: Subject to any disclaimer, the term of this patent is extended or adjusted under 35 U.S.C. 154(b) by 79 days.

This patent is subject to a terminal disclaimer.

(21) Appl. No.: 14/855,656

(22) Filed: Sep. 16, 2015

(65) Prior Publication Data

US 2017/0076494 A1    Mar. 16, 2017

(51) Int. Cl.
*G06T 19/00* (2011.01)
*G06F 17/50* (2006.01)
(Continued)

(52) U.S. Cl.
CPC ............ *G06T 19/003* (2013.01); *G06F 3/011* (2013.01); *G06F 17/50* (2013.01);
(Continued)

(58) Field of Classification Search
CPC .................. G06T 19/006; G06T 13/40; G06T 13/00–13/80; G06F 17/5095;
(Continued)

(56) References Cited

U.S. PATENT DOCUMENTS 8,624,924 B2    1/2014  Dobbins et al.
2003/0018454 A1*  1/2003  Winkler ............. G06F 17/5095
                                                    703/1

(Continued)

OTHER PUBLICATIONS

Qiu, Shiguang, et al. "Virtual human modeling for interactive assembly and disassembly operation in virtual reality environment." The International Journal of Advanced Manufacturing Technology 69.9-12 (2013): 2355-2372.*

(Continued)

*Primary Examiner* — Daniel Hajnik

(74) *Attorney, Agent, or Firm* — Yee & Associates, P.C.

(57) ABSTRACT

An object management system, an aircraft design system, and a method for managing an object. A three-dimensional environment with a model of an object and an avatar representing a human operator from a viewpoint relative to the avatar is displayed on a display system. A motion of the human operator is detected. An interaction between the avatar and the model of the object is identified in real time using information about motions of the human operator that are detected in real time. The interaction changes a group of dimensions in the model of the object. Further, the interaction between the avatar and the model of the object in the three-dimensional environment is displayed on the display system, enabling design changes in the model of the object made by the human operator.

22 Claims, 17 Drawing Sheets

(51) Int. Cl.
    *G06F 3/01* (2006.01)
    *G06T 17/00* (2006.01)

(52) U.S. Cl.
    CPC .......... *G06F 17/5095* (2013.01); *G06T 17/00* (2013.01); *G06T 19/006* (2013.01); *G06T 2219/012* (2013.01); *G06T 2219/2008* (2013.01); *G06T 2219/2012* (2013.01); *G06T 2219/2021* (2013.01)

(58) Field of Classification Search
    CPC .... G06F 17/50–17/504; G06F 17/5086; G06F 3/011–3/014; G06F 3/017; G06F 17/5004; G06F 17/5009; G06F 17/5018
    See application file for complete search history.

(56) References Cited

U.S. PATENT DOCUMENTS

| | | | |
|---|---|---|---|
| 2006/0041535 A1* | 2/2006 | Qamhiyah | G06F 17/30247 |
| 2009/0109229 A1 | 4/2009 | Hamilton, II et al. | |
| 2012/0303336 A1 | 11/2012 | Becker et al. | |
| 2015/0278414 A1 | 10/2015 | Zhou et al. | |

OTHER PUBLICATIONS

Roberts, David, et al. "Supporting social human communication between distributed walk-in displays." Proceedings of the ACM symposium on Virtual reality software and technology. ACM, 2004.*

"CAD/CAM—VROOM," WorldViz, LLC, copyright 2002-2015, 3 pages, accessed Aug. 5, 2015. http://www.worldviz.com/industries/cad#Training_Tool.

"Vicon Engineering," Vicon Motion Systems Ltd., 6 pages, accessed Aug. 5, 2015. http://www.vicon.com/motion-capture/engineering.

"Kinect Fusion," Microsoft Corporation, copyright 2015, 5 pages, accessed Aug. 5, 2015. https://msdn.microsoft.com/en-us/enus/library/dn188670.aspx.

Krassenstein, "New Details on VRClay, The Virtual Reality CAD Software Which Could Transform the 3D Modelling Space," 3DPrint.com, Oct. 2014, 4 pages, accessed Aug. 28, 2015. http://3dprint.com/17752/vrclay-3d-model-oculus-rift/.

Mings, "SolidWorks World: Post3D Brings Immersive 3D Product Design," SolidSmack, Jan. 2011, 12 pages, accessed Aug. 5, 2015. http://www.solidsmack.com/cad-design-news/solidworks-world-post3d-brings-immersive-3d-to-product-design-sww11/.

Gabrys et al., "Immersive Object Testing System," U.S. Appl. No. 14/855,700, filed Sep. 16, 2015, 69 pages.

Extended European Search Report, dated Nov. 7, 2016, regarding Application No. EP16177460.9, 13 pages.

Leu et al., "CAD model based virtual assembly simulation, planning and training," CIRP Annals—Manufacturing Technology, vol., 62, No. 2, Dec. 2013, pp. 799-822.

Masry et al., "A Sketch-Based Interface for Iterative Design and Analysis of 3D Objects," Proceedings of ACM SIGGRAPH 2007 courses, Article No. 31, Aug. 2007, 10 pages.

Office Action, dated Jan. 26, 2017, regarding U.S. Appl. No. 14/855,700, 24 pages.

Clothier et al., "Augmented Reality Visualization Tool for Kings Stormwater Bridge", the Proceedings of Visualization, Imaging and Image Processing (VIIP 2004), Sep. 2004, 6 pages.

Florentino et al., "Interactive 'touch and see' FEM Simulation using Augmented Reality", International Journal of Engineering Education, Jan. 2009, 16 pages.

Uva et al., "Distributed design review using tangible augmented technical drawings", Computer-Aided Design, vol. 42, © 2010 pp. 364-372. www.elsevier.com/locate/cad.

Final Office Action, dated May 31, 2017, regarding U.S. Appl. No. 14/855,700. 38 pages.

Notice of Allowance, dated Sep. 13, 2017, regarding U.S. Appl. No. 14/855,700, 9 pages.

* cited by examiner

IMMERSIVE DESIGN MANAGEMENT SYSTEM

CROSS-REFERENCE TO RELATED APPLICATION

This application is related to the following patent application: entitled "Immersive Object Testing System", Ser. No. 14/855,700; filed even date herewith, assigned to the same assignee, and incorporated herein by reference.

BACKGROUND INFORMATION

1. Field

The present disclosure relates generally to managing an object and, in particular, to managing the design of an object in an immersive environment.

2. Background

Computer-aided design (CAD) software is often used in creating, modifying, or analyzing a design for an object. The object may be, for example, an aircraft, a flight deck, a landing gear system, an engine housing, or some other suitable object.

A designer may generate a computer-aided design of an object such as the flight deck of an aircraft using specifications, preliminary drawings, and other input. The computer-aided design is contained in a model of the object.

An analysis of the design may be performed. For example, an engineer may perform a finite element analysis on the design of the flight deck. The finite element analysis may be used to determine how the object will handle stress, temperatures, and other environmental factors.

Another person, an ergonomic specialist, may analyze the model with respect to ergonomics. For example, the person may review the human factors in the design of the flight deck to determine whether a pilot may interact efficiently with different components in the flight deck.

For example, the ergonomic specialist may review the dimensions for parts of the flight deck such as a seat, a flight stick, switches, and other parts that a pilot may interact with in the flight deck. The review of these dimensions may be used to determine whether sufficient ergonomics are present in the design of the flight deck to perform operations for the aircraft. The dimensions may also be reviewed to determine whether a desired level of comfort would be present for the flight of the aircraft. In some cases, the creation of some parts of the flight deck may be needed for the ergonomic analysis.

The engineer and the ergonomic specialist send feedback to the designer. The feedback may be a report sent by email or a hard copy that may be sent by regular mail or overnight delivery.

The designer may then make changes to the model of the object using the feedback. Further testing and analysis may be performed and further modifications to the model may be made in this manner until the flight deck has a desired level of performance.

This type of process, however, involves multiple people interacting with each other and may take more time than desired to perform iterations in testing, analysis, and modifying design changes. For example, scheduling between the designer, the engineer, and the ergonomic specialist to analyze and modify the design may take more time than desired. Also, the engineer may need to schedule a time to run the finite element analysis on the model of the flight deck.

The ergonomic specialist may not need the results of the finite element analysis, but may have other reviews for other designs in models of other objects to perform prior to evaluating the design for the flight deck. The analysis performed by the ergonomic specialist may require fabrication of physical parts of the flight deck as needed. Also, each time a change in the model occurs, additional parts may be fabricated to evaluate the change in the model. The fabrication of the parts for the analysis also may take more time and expense than desired.

Therefore, it would be desirable to have a method and apparatus that take into account at least some of the issues discussed above, as well as other possible issues. For example, it would be desirable to have a method and apparatus that overcome a technical problem with managing design changes in models of objects.

SUMMARY

An embodiment of the present disclosure provides an object management system comprising a model manager that creates an avatar representing a human operator; places the avatar in a three-dimensional environment with a model of an object; displays the three-dimensional environment with the model of the object and the avatar from a viewpoint relative to the avatar on a display system; and identifies an interaction between the avatar and the model of the object in real time using information about motions of the human operator detected in real time from a motion capture system. The interaction changes a group of dimensions in the model of the object. The object management system also displays the interaction between the avatar and the model of the object in the three-dimensional environment on the display system, enabling design changes in the model of the object made by a human operator.

Another embodiment of the present disclosure provides an aircraft design system comprising a motion capture system and a model manager. The motion capture system detects motions of a human operator and generates information about the motions. The model manager creates an avatar representing the human operator; places the avatar in a three-dimensional environment with a model of an aircraft; displays the three-dimensional environment with the model and the avatar from a viewpoint relative to the avatar on a display system viewable by the human operator; identifies an interaction between the avatar and the model of the aircraft in real time that changes a group of dimensions in the model of the aircraft using the information about the motions of the human operator detected in real time; displays the model of an object with a change in the group of dimensions in the model of the aircraft in the three-dimensional environment on the display system; and updates a file storing the model of the aircraft that reflects the change in the group of dimensions in the model of the aircraft, enabling design changes in the model of the aircraft made by the human operator.

Yet another embodiment of the present disclosure provides a method for managing an object. A three-dimensional environment with a model of the object and an avatar representing a human operator from a viewpoint relative to the avatar is displayed on a display system. A motion of the human operator is detected. An interaction between the avatar and the model of the object is identified in real time using information about motions of the human operator that are detected in real time. The interaction changes a group of dimensions in the model of the object. Further, the interaction between the avatar and the model of the object in the three-dimensional environment is displayed on the display system, enabling design changes in the model of the object made by the human operator.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. For example, the illustrative embodiments recognize and take into account that it would be desirable to reduce the number of people involved in designing and testing objects or reduce the effort needed in performing iterations in testing, analysis, and design modifications.

Thus, the illustrative embodiments provide a method and apparatus for managing an object. In one illustrative example, a model manager creates an avatar representing the human operator and places the avatar in a three-dimensional environment with a model of the object. The model manager displays the three-dimensional environment with the model of the object and the avatar from a viewpoint relative to the avatar on a display system. An interaction between the avatar and the model of the object is identified by the model manager in real time using the information about the motions of the human operator detected in real time from a motion capture system.

The interaction changes a group of dimensions in the model of the object. As used herein, a "group of," when used with reference to items, means one or more items. For example, a "group of dimensions" is one or more dimensions. The model manager displays the interaction between the avatar and the model of the object in the three-dimensional environment on the display system, enabling design changes in the model of the object made by a human operator. As a result, the same person evaluating the design of an object may also make changes to the model of the object.

Figure 1:
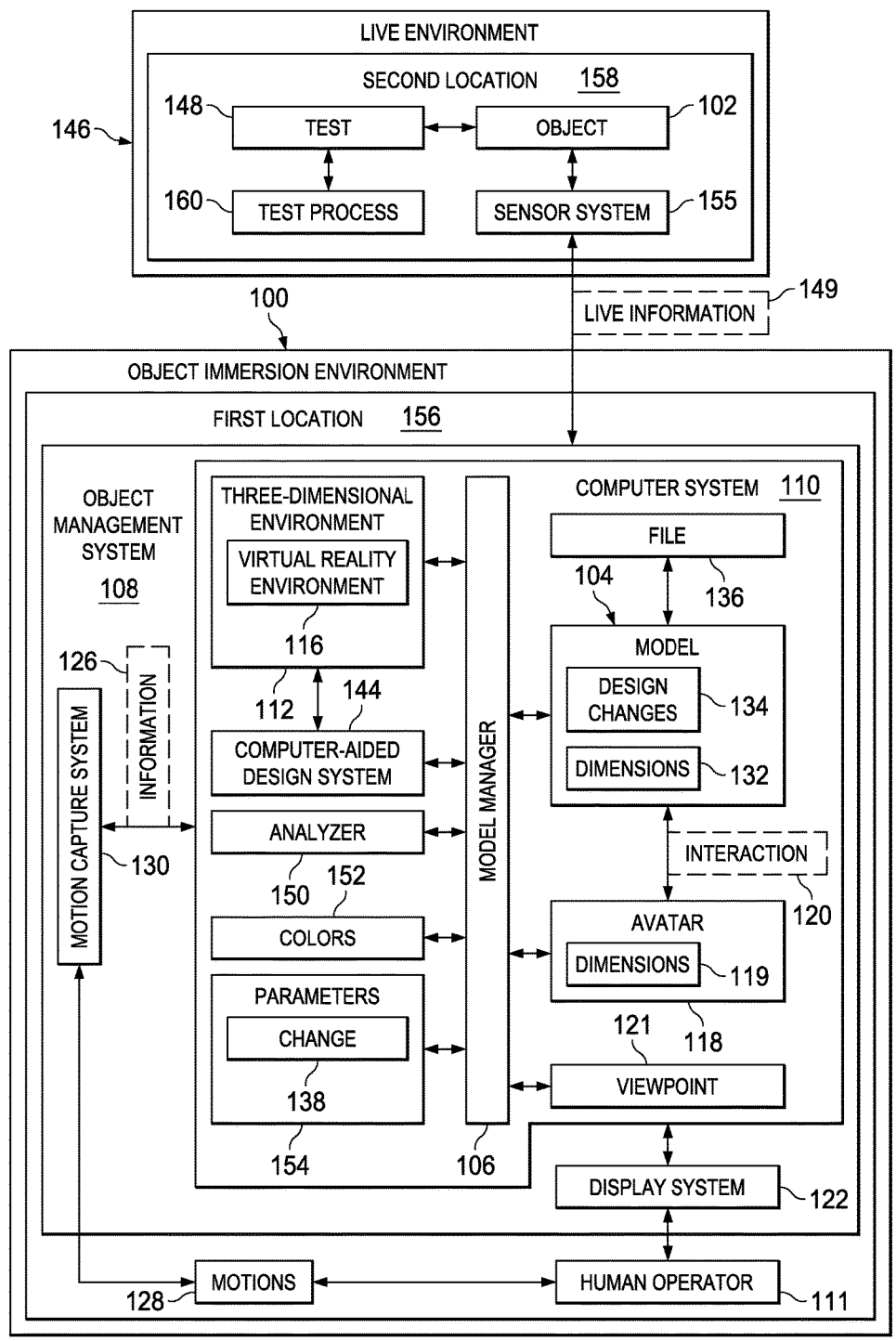
FIG. 1 is an illustration of a block diagram of an object immersion environment in accordance with an illustrative embodiment.

With reference now to the figures and, in particular, with reference to FIG. 1, an illustration of a block diagram of an object immersion environment is depicted in accordance with an illustrative embodiment. In this illustrative example, object immersion environment 100 may be used to perform at least one of designing or analyzing object 102 using model 104.

As used herein, the phrase "at least one of," when used with a list of items, means different combinations of one or more of the listed items may be used and only one of each item in the list may be needed. In other words, "at least one of" means any combination of items and number of items may be used from the list, but not all of the items in the list are required. The item may be a particular object, thing, or category.

For example, without limitation, "at least one of item A, item B, or item C" may include item A, item A and item B, or item B. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

In the illustrative example, model 104 represents object 102. Model 104 is an electronic representation of object 102.

As depicted, model 104 is a two-dimensional or three-dimensional design of object 102. For example, model 104 of object 102 may be selected from one of a computer-aided design (CAD) model, a finite element method (FEM) model, a computer-aided (CAM) model, and some other type of model.

Object 102 may be a current object already in production or an object that may be produced at a future point in time. As depicted, object 102 also may represent another object such as a prop, mockup, or prototype. Object 102 may take various forms. For example, object 102 may be selected from one of a mobile platform, a stationary platform, a land-based structure, an aquatic-based structure, a space-based structure, an aircraft, a surface ship, a tank, a personnel carrier, a train, a spacecraft, a space station, a satellite, a submarine, an automobile, a power plant, a bridge, a dam, a house, a manufacturing facility, a building, a wing, a beam, an engine housing, a seat, a stabilizer, and other suitable objects.

In this illustrative example, model manager 106 manages model 104 and is a component in object management system 108. Model manager 106 is located in computer system 110 and is used in managing, designing, and testing object 102. When object 102 is an aircraft, object management system 108 may be an aircraft design system implementing model manager 106.

Model manager 106 may be implemented in software, hardware, firmware, or a combination thereof. When software is used, the operations performed by model manager 106 may be implemented in program code configured to run on hardware, such as a processor unit. When firmware is used, the operations performed by model manager 106 may be implemented in program code and data and stored in persistent memory to run on a processor unit. When hardware is employed, the hardware may include circuits that operate to perform the operations in model manager 106.

In the illustrative examples, the hardware may take the form of a circuit system, an integrated circuit, an application-specific integrated circuit (ASIC), a programmable logic device, or some other suitable type of hardware configured to perform a number of operations. With a programmable logic device, the device may be configured to perform the number of operations. The device may be reconfigured at a later time or may be permanently configured to perform the number of operations. Programmable logic devices include, for example, a programmable logic array, programmable array logic, a field-programmable logic array, a field-programmable gate array, and other suitable hardware devices. Additionally, the processes may be implemented in organic components integrated with inorganic components and may be comprised entirely of organic components, excluding a human being. For example, the processes may be implemented as circuits in organic semiconductors.

Computer system 110 is a hardware system and includes one or more data processing systems. When more than one data processing system is present, those data processing systems may be in communication with each other using a communications medium. The communications medium may be a network. The data processing systems may be selected from at least one of a computer, a server computer, a tablet, or some other suitable data processing system.

As depicted, model manager 106 immerses human operator 111 into three-dimensional environment 112 in a manner that allows human operator 111 to interact with three-dimensional environment 112 and, in particular, with model 104 of object 102. The immersion of human operator 111 is such that human operator 111 is provided with a virtual reality experience such that three-dimensional environment 112 is virtual reality environment 116.

During operation, model manager 106 creates avatar 118, representing human operator 111, and places avatar 118 into three-dimensional environment 112 with model 104 of object 102. In the illustrative example, avatar 118 has dimensions 119 substantially matching human operator 111. In other words, avatar 118 may have dimensions 119 that represent human operator 111 in three-dimensional environment 112.

In another illustrative example, avatar 118 may have dimensions 119 of a person that performs ergonomic testing of object 102, rather than matching human operator 111. Ergonomic testing is testing the manner in which a human interacts with object 102. Ergonomic testing is used to refine object 102 to optimize for human use. Ergonomic testing may include testing for at least one of usability, comfort, likelihood of injury, fatigue, discomfort, productivity, or other suitable factors relating to a human operator using object 102.

For example, testing of object 102 may be based on an average-sized pilot. Avatar 118 may have dimensions 119 selected for a person such as an average-sized pilot, when human operator 111 is taller than the average-sized pilot.

In this manner, ergonomic testing may be performed in a desired manner. For example, when object 102 is an aircraft, interaction 120 of avatar 118 with controls in the aircraft tests usability of the controls as part of ergonomic testing. The usability may be, for example, how well avatar 118 can reach and move the controls from a seat in the flight deck.

Model manager 106 displays three-dimensional environment 112. Model 104 of object 102 and avatar 118 are displayed by model manager 106 in three-dimensional environment 112 from viewpoint 121 relative to avatar 118 on display system 122 viewed by human operator 111.

In the illustrative example, viewpoint 121 relative to avatar 118 may be, for example, a distance from avatar 118 or the eyes of avatar 118. When viewpoint 121 is a point that is a distance from avatar 118, that distance is fixed, and moves and turns as avatar 118 moves and turns. The distance may be changed based on a command from human operator 111 or some other source. Further, viewpoint 121 may switch between the fixed distance and the eyes of avatar 118.

Model manager 106 identifies interaction 120 between avatar 118 and model 104 of object 102 in real time. Interaction 120 is detected using information 126 about motions 128 of human operator 111 detected in real time by motion capture system 130. Motion capture system 130 is a component in object management system 108.

In the illustrative example, display system 122 is selected from at least one of a display device, a computer monitor, glasses, a head-mounted display device, a tablet computer, a mobile phone, a projector, a heads-up display, a holographic display system, a virtual retinal display, or some other suitable display device. As depicted, motion capture system 130 may take different forms. For example, motion capture system 130 may include at least one of an optical motion capture system, an inertial motion capture system, a mechanical motion capture system, a magnetic motion capture system, a camera, an infrared camera, a laser scanner, an accelerometer system, a gyroscope, a motion capture suit, or some other suitable device.

In the illustrative example, interaction 120 may take a number of different forms. As depicted, interaction 120 may be selected from one of moving a portion of model 104 of object 102 that is designed to be movable and displacing the portion of model 104 of object 102. In the illustrative example, a displacement, with respect to model 104, occurs when a portion of model 104 of object 102 that is not designed to be moveable is moved.

For example, a displacement occurs when interaction 120 increases or decreases a bend in a wing. A displacement also occurs when interaction 120 increases the length of a rod. As another example, a displacement occurs when interaction 120 forms an indentation in the surface of an aircraft skin.

When interaction 120 moves or displaces a portion of model 104 of object 102, interaction 120 changes a group of dimensions 132 in model 104 of object 102. The change in the group of dimensions 132 reflects the displacement caused by human operator 111 through avatar 118.

In this manner, human operator 111 may make design changes 134 to model 104 of object 102. These and other types of interaction 120 that move a portion of model 104 of object 102 is not designed to move are a displacement of model 104 that changes a group of dimensions 132.

As depicted, model manager 106 displays interaction 120 between avatar 118 and model 104 of object 102 in three-dimensional environment 112 on display system 122, enabling human operator 111 to make design changes 134 in model 104 of object 102. In the illustrative example, model manager 106 updates file 136 storing model 104 of object 102 such that file 136 reflects change 138 in the group of dimensions 132 in model 104 of object 102, enabling human operator 111 to make design changes 134 in model 104 of object 102. As depicted, file 136 may be, for example, a computer-aided design (CAD) file, a finite element method (FEM) file, a computer-aided (CAM) file, or some other suitable file.

In one illustrative example, object management system 108 may include computer-aided design system 144. In this example, some of the operations performed by model manager 106 may be performed using computer-aided design system 144 under the direction of model manager 106. For example, computer-aided design system 144 displays model 104 in three-dimensional environment 112. With this example, model manager 106 directs movement of avatar 118 and identifies changes to group of dimensions 119 based on interaction 120 of avatar 118 with model 104.

Model manager 106 may generate and send avatar 118 to computer-aided design system 144 for display. Computer-aided design system 144 displays model 104 of object 102 in three-dimensional environment 112 with avatar 118.

In this example, model manager 106 identifies movement of avatar 118 occurring through identifying motions 128 of human operator 111 from motion capture system 130. Model manager 106 controls movement of avatar 118 and may direct computer-aided design system 144 on how avatar 118 moves when object management system 108 includes computer-aided design system 144.

Thus, one or more technical solutions are present that overcome a technical problem with managing design changes in models of objects. As a result, one or more technical solutions using model manager 106 may provide a technical effect of reducing time needed to make design changes to models of objects.

The illustrative embodiments also recognize and take into account that part of designing objects often includes testing of the objects. For example, objects are often tested in an environment that subjects the objects to different conditions to determine how the objects perform. After the testing, the performance may be analyzed by an engineer to determine how the object performed as compared to specifications defining a desired performance for the object.

In some cases, further testing may be needed. The illustrative embodiments recognize and take into account that additional testing may require working out logistics for performing the new tests. Further, in some cases, a new object may be needed for the test. The object tested may have developed inconsistencies as a result of the test and, as a result, may not be suitable for further testing.

Therefore, the illustrative embodiments recognize and take into account that it would be desirable to have a method and apparatus that take into account at least some of the issues discussed above. For example, it would be desirable to have a method and apparatus that overcome a technical problem with the time and cost of testing objects.

Thus, in another illustrative example, object immersion environment 100 may be applied to immerse human operator 111 in three-dimensional environment 112 during testing of object 102. For example, three-dimensional environment 112 may be used to manage testing of object 102 in live environment 146 as an immersive object testing system.

For example, test 148 may be performed on object 102. In other words, test 148 is performed on object 102 as a physical object, rather than using a simulation of test 148 on object 102.

During operation, model manager 106 creates avatar 118 representing human operator 111 and places avatar 118 in three-dimensional environment 112 with model 104 of object 102. Model manager 106 displays three-dimensional environment 112 with model 104 of object 102 and avatar 118 from viewpoint 121 relative to avatar 118 on display system 122 viewed by human operator 111.

Further, model manager 106 receives live information 149 about object 102 that is under testing in live environment 146. In the illustrative example, live information 149 includes at least one of modulation data, temperature, acceleration, velocity, translation, temperature, vibration data, force, acoustic data, or other suitable data.

Model manager 106 identifies change 138 in object 102 from applying live information 149 to model 104 of object 102 and displays change 138 in model 104 of object 102 as seen from viewpoint 121 relative to avatar 118. In the illustrative example, live information 149 may be applied to model 104 using analyzer 150. For example, analyzer 150 may be a finite element analysis system or some other suitable type of process.

In other words, model manager 106 receives live information 149 from live environment 146 for the object 102; identifies an effect of live information 149 on model 104 of object 102 based on live information 149, and displays effect on model 104 of object 102 in the three-dimensional environment 112. Live environment 146 may be one in which object 102 is used during operation of object 102. In another example, live environment 146 may be a test environment, such as a laboratory, a test chamber, a wind tunnel, or some other location.

In one example, model manager 106 displays a group of colors 152 on model 104 of object 102 in three-dimensional environment 112 as seen from viewpoint 121 relative to avatar 118 in which the group of colors 152 indicates amounts of a group of parameters 154 for object 102. For example, the group of parameters 154 may be selected from at least one of stress, strain, displacement, acoustics, computational fluid dynamics (CFD), temperature, or some other suitable parameter for object 102.

In the illustrative example, sensor system 155 generates live information 149 about object 102 under testing in live environment 146. As depicted, sensor system 155 is selected from at least one of a laser scanner, a strain gauge, an accelerometer, a force sensing resistor, a vibration sensor, a temperature sensor, an impact detector, a gyroscopic sensor, an inertial measurement unit, or some other suitable sensor device.

As depicted, change 138 is displacement of object 102 and model 104 is a finite element method model. In identifying change 138 in object 102 from applying live information 149 to model 104 of object 102, model manager 106 performs a finite element analysis on model 104 using live information 149 about the displacement of object 102 and identifies the stress in object 102 from the finite element analysis.

In this illustrative example, human operator 111 and object 102 do not need to be in the same location. For example, human operator 111 may be in first location 156, and object 102 that is under testing may be in second location 158. For example, first location 156 may be a computer lab, while second location 158 may be an airspace over a desert.

With respect to testing of object 102, the illustrative embodiments recognize and take into account that during testing of object 102, the data from the test are often reviewed after the test has completed. For example, measurements of displacement may be made during testing of object 102 with those measurements analyzed after testing is completed.

In some cases, the displacement may result in undesired inconsistencies to occur in object 102. For example, if object 102 is a wing, cracks, delamination, breaks, or other inconsistencies may occur. As a result, a new object is manufactured for further testing. Manufacturing new objects for testing may result in more time and expense for testing objects than desired.

With displaying changes in model 104 of object 102 during testing, test process 160 used in testing object 102 may be changed based on change 138 identified in model 104 of object 102 as seen from viewpoint 121 relative to avatar 118. The change in test process 160 may be made during a time selected from at least one of during a test of object 102 or after the test of object 102.

In one illustrative example, one or more technical solutions are present that overcome a technical problem with a method and apparatus that overcome a technical problem with managing design changes in models of objects. As a result, one or more technical solutions may provide a technical effect of reducing time needed to make design changes in models of objects.

As a result, computer system 110 operates as a special purpose computer system in which model manager 106 in computer system 110 enables human operator 111 to interact with and make design changes 134 in model 104 through avatar 118. For example, changes were made in a group of dimensions 132 in model 104 that may be saved in file 136 for later use in analysis, prototype fabrication, product manufacturing, or some other suitable operation using model 104. In other words, the change is not merely a graphical change that is displayed on display system 122. These changes may be made in a manner to manage at least one of the design, testing, or production of object 102 in an illustrative example.

In particular, model manager 106 transforms computer system 110 into a special purpose computer system as compared to currently available general computer systems that do not have model manager 106. With model manager 106, changes to test process 160 may be made for test 148 of object 102. Change in test process 160 may occur during testing of object 102 through receiving live information 149 and immersing human operator 111 into three-dimensional environment one 112 to obtain a visualization of a group of parameters 154 of object 102 that is currently being tested. The visualization is performed in real time in the illustrative example, and may be used to refine test process 160 during or after test 148 with use of model manager 106.

The illustration of object immersion environment 100 in FIG. 1 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, a group of objects in addition to or in place of object 102 may be placed into three-dimensional environment 112 using models for the group of objects. Human operator 111 may interact with the group of models for the group of objects in the same manner as with model 104 for object 102.

In another illustrative example, three-dimensional environment 112 may be viewed by another human operator in addition to human operator 111. The view may be from the same viewpoint or another displayed to human operator 111. In still another illustrative example, another avatar for another human operator may be placed into three-dimensional environment 112 in addition to avatar 118 for human operator 111. In this manner, multiple human operators may be immersed into three-dimensional environment 112 and interact with object 102.

In yet another illustrative example, three-dimensional environment 112 may take other forms other than virtual reality environment. For example, three-dimensional environment 112 may be an augmented reality environment.

Figure 2:
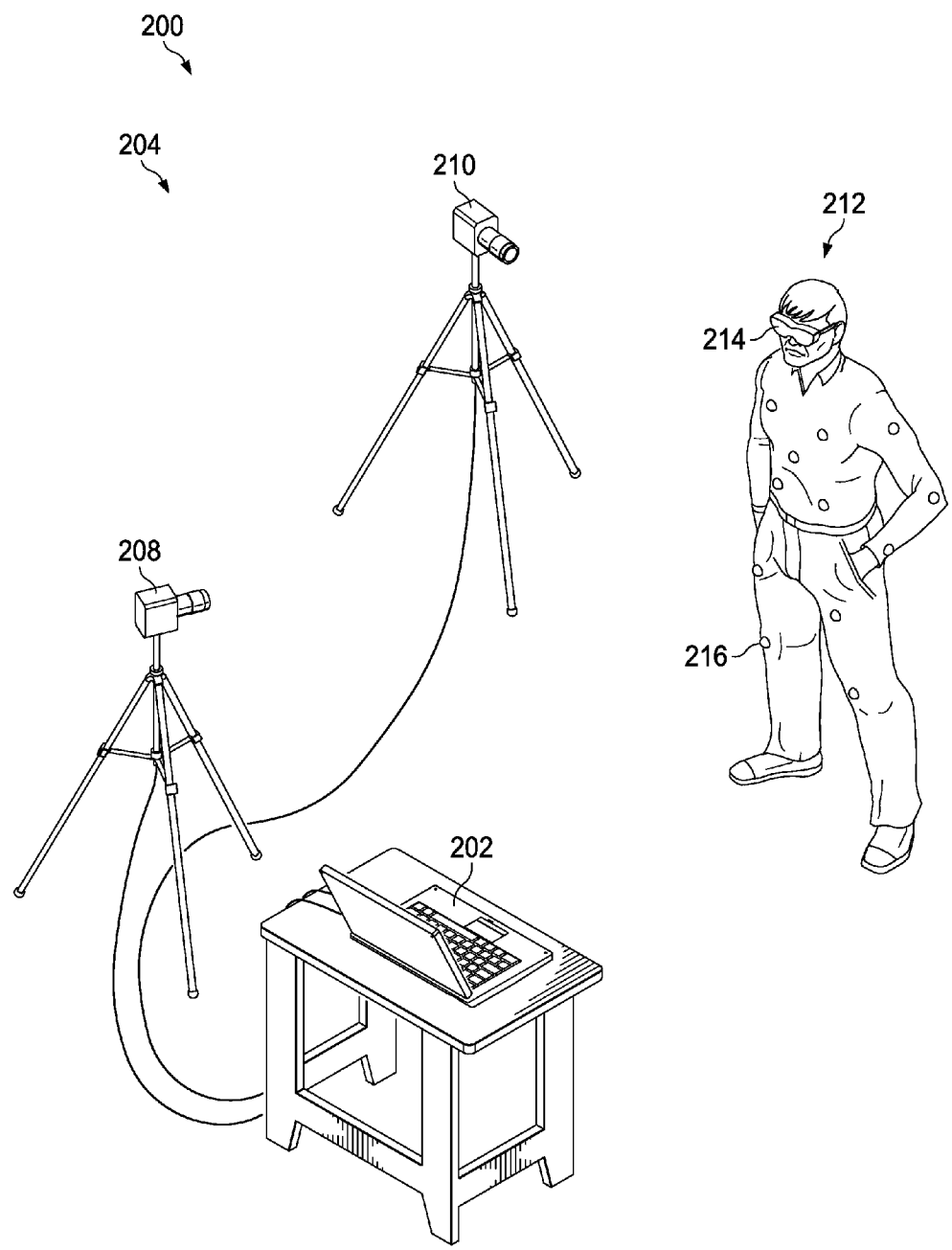
FIG. 2 is an illustration of an object immersion environment in accordance with an illustrative embodiment.

With reference now to FIG. 2, an illustration of an object immersion environment is depicted in accordance with an illustrative embodiment. Object immersion environment 200 is an example of one implementation of object immersion environment 100 shown in block form in FIG. 1.

In this illustrative example, object immersion environment 200 includes model manager 202 and optical system 204. As depicted, model manager 202 is implemented in a computer and is an example of one implementation for model manager 106 shown in block form in FIG. 1. Optical system 204 is an example of one implementation for motion capture system 130 shown in block form in FIG. 1.

As depicted, optical system 204 includes camera 208 and camera 210. These cameras individually or cooperatively capture data that may be used to obtain the three-dimensional position of human operator 212 using a marker or markerless tracking system.

In this illustrative example, human operator 212 is an example of human operator 111 shown in block form in FIG. 1. In this illustrative example, human operator 212 wears head-mounted display 214 and marker suit 216.

Head-mounted display 214 is an example of a device that may be used to implement display system 122 shown in block form in FIG. 1. As depicted, marker suit 216 may have reflective markers, light emitting diodes, or other types of passive or active markers that are detectable by optical system 204 to identify motions of human operator 212.

Figure 3:
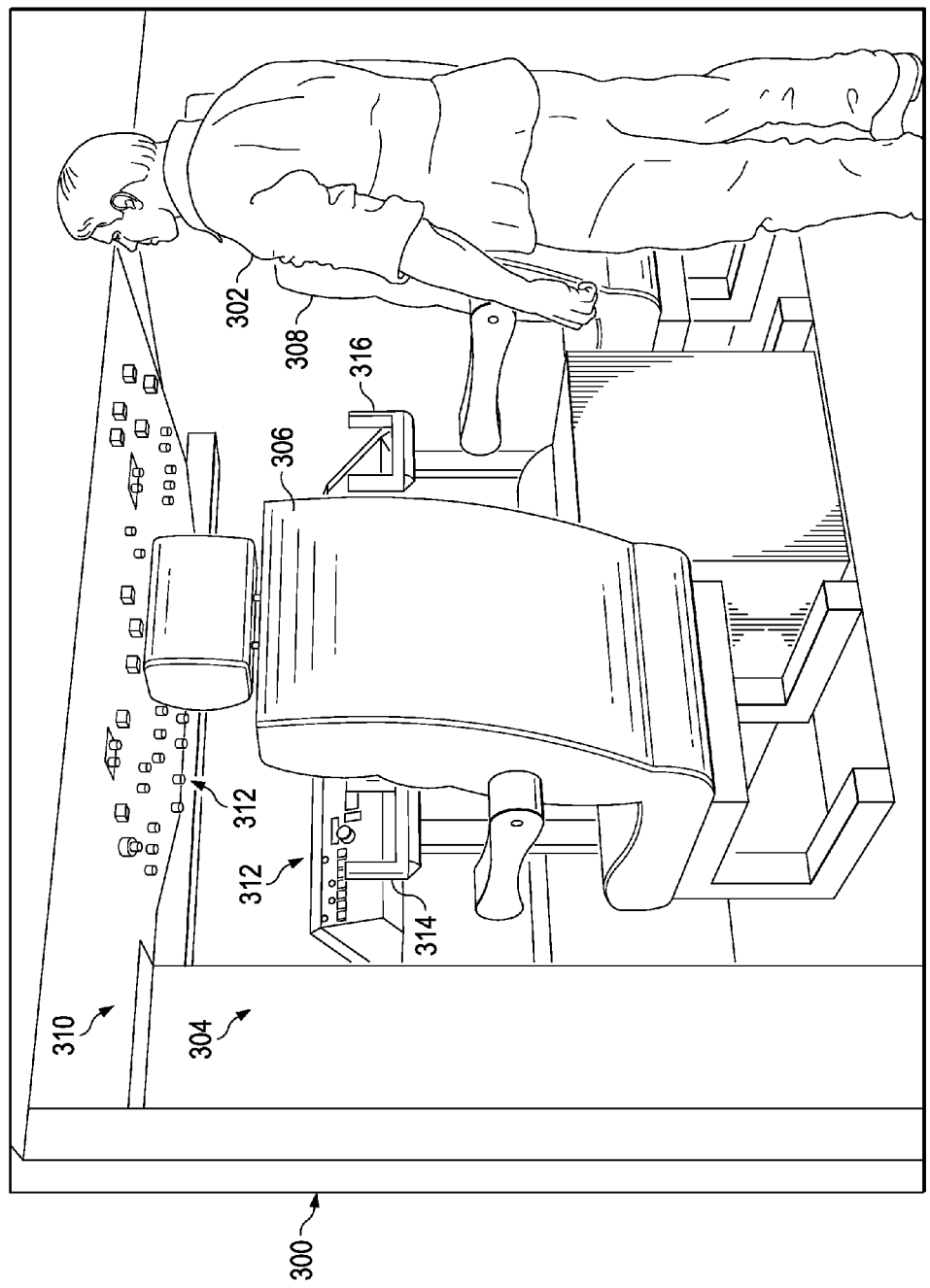
FIG. 3 is an illustration of a display of a three-dimensional environment to a human operator in accordance with an illustrative embodiment.

Turning now to FIG. 3, an illustration of a display of a three-dimensional environment to a human operator is depicted in accordance with an illustrative embodiment. In this illustrative example, display 300 is an example of a display seen by human operator 212 on head-mounted display 214 in FIG. 2.

In this illustrative example, display 300 is a display of a three-dimensional environment generated by model manager 202 in FIG. 2. Display 300 shows avatar 302 with model 304 of a flight deck.

As depicted, display 300 is from a viewpoint relative to avatar 302. The viewpoint in this example is from a point that is a distance away from avatar 302, such as a third person viewpoint. Avatar 302 represents human operator 212. For example, avatar 302 has dimensions that correspond to human operator 212 in this particular example.

As depicted, human operator 212 may move with the motion being translated into corresponding movement of avatar 302 with respect to model 304 of the flight deck. Thus, human operator 212 may be immersed in the virtual reality environment with movements of human operator 212 being translated into corresponding movements of avatar 302.

In this illustrative example, the flight deck in model 304 includes seat 306, seat 308, and controls 310. For example, controls 310 include, switches 312, flight stick 314, and flight stick 316. Other controls are present in model 304 of the flight deck, but are not described to avoid obscuring the description of the manner in which model manager 202 operates to provide display 300.

Figure 4:
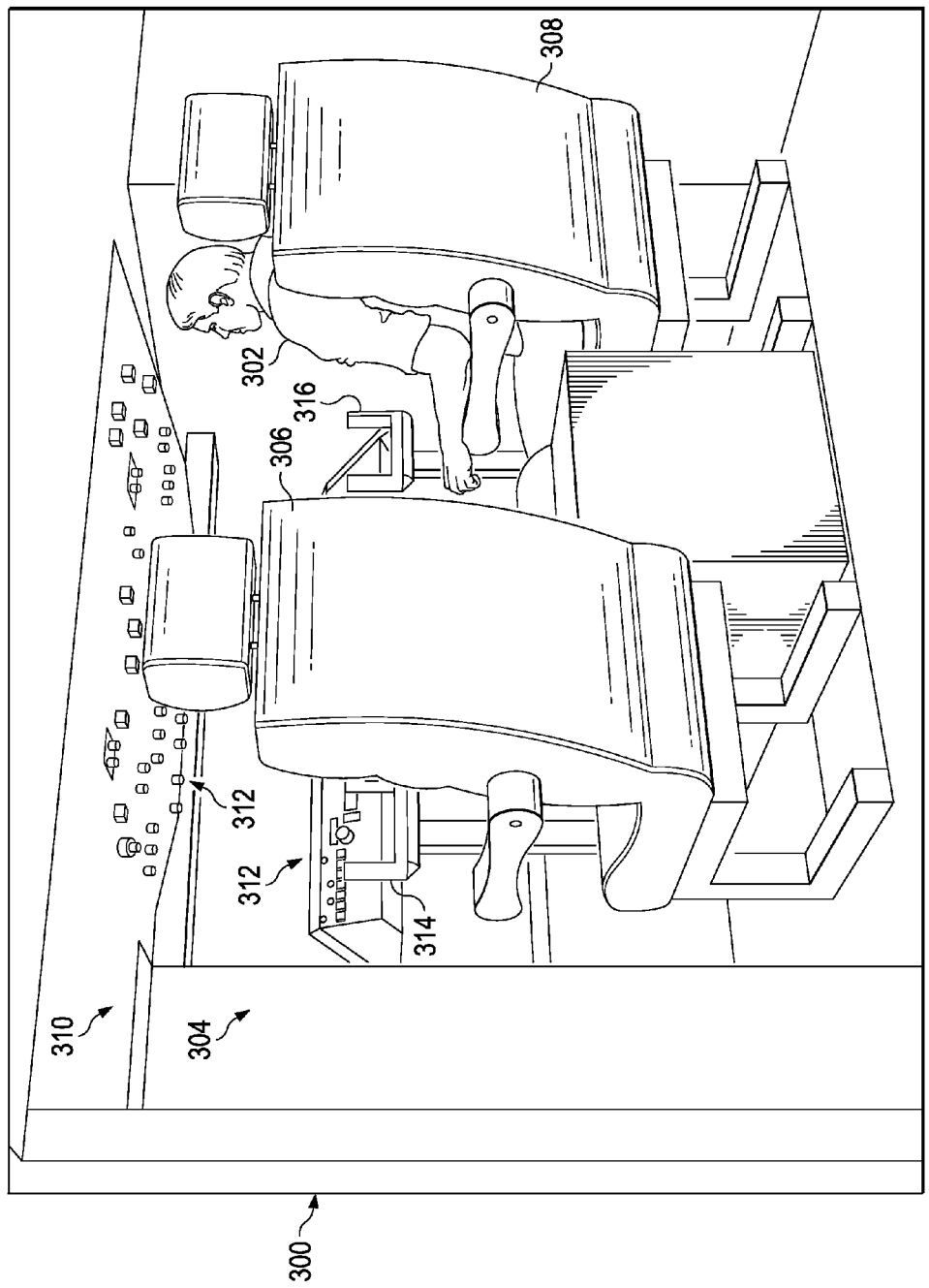
FIG. 4 is an illustration of a display of a three-dimensional environment to a human operator in accordance with an illustrative embodiment.

Turning now to FIG. 4, an illustration of a display of a three-dimensional environment to a human operator is depicted in accordance with an illustrative embodiment. In the illustrative examples, the same reference numeral may be used in more than one figure. This reuse of a reference numeral in different figures represents the same element in the different figures. In this view, motions of human operator 212 have caused avatar 302 to move into seat 308 in model 304 of the flight deck.

Figure 5:
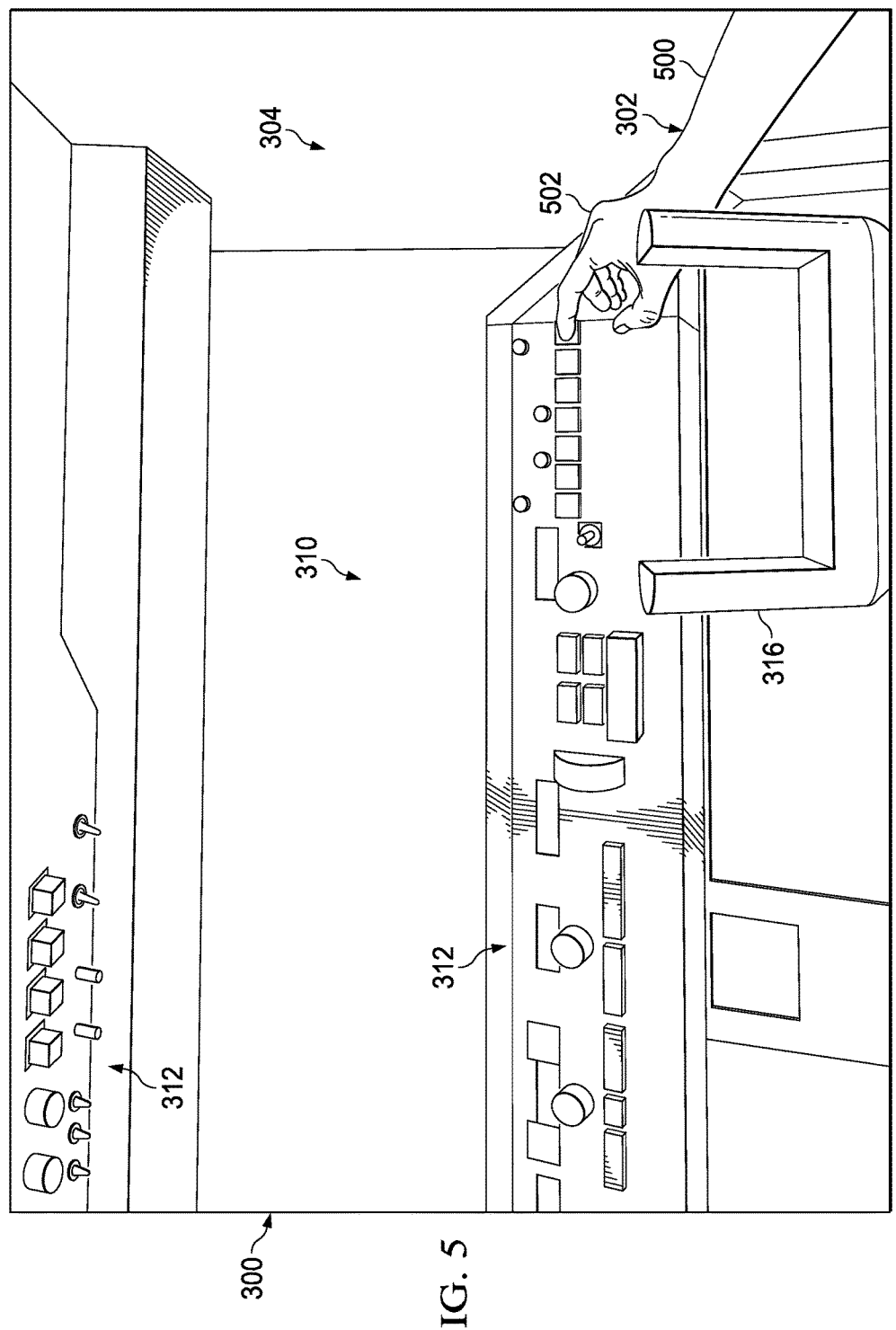
FIG. 5 is an illustration of a display of a three-dimensional environment to a human operator in accordance with an illustrative embodiment.

With reference now to FIG. 5, an illustration of a display of a three-dimensional environment to a human operator is depicted in accordance with an illustrative embodiment. In this figure, display 300 is a viewpoint from the eyes of avatar 302 and is a first person point of view. With this viewpoint, a more realistic view and immersion into the three-dimensional environment with model 304 of the flight deck is provided to human operator 212.

As depicted in this example, human operator 212 may have arm and hand movement such that right arm 500 with right hand 502 of avatar 302 reaches and operates one or more of switches 312 as part of testing ergonomics of the flight deck. As a result, human operator 212 is immersed such that the operation of switches 312 appears to be those performed by human operator 212.

Figure 6:
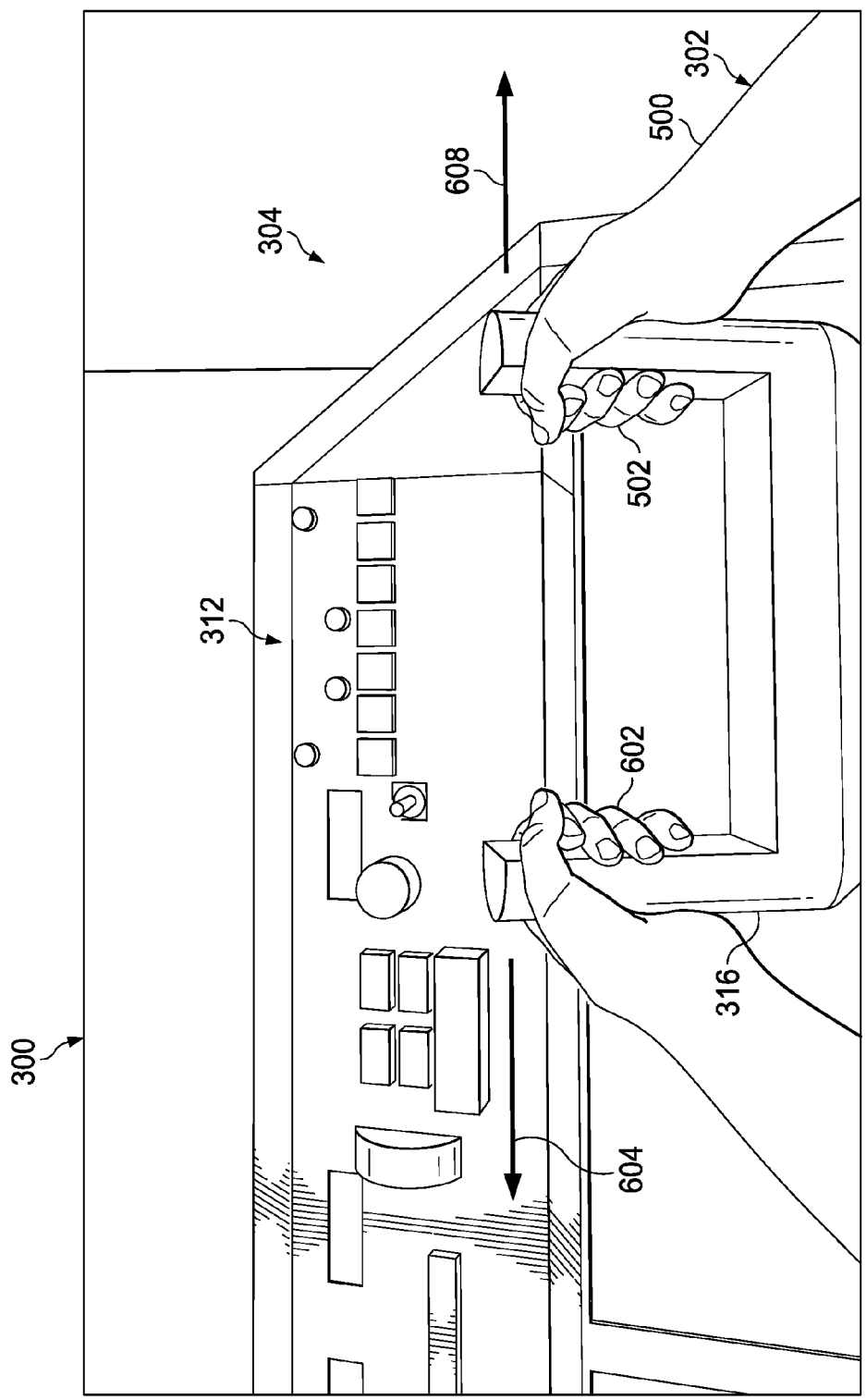
FIG. 6 is an illustration of a display of a three-dimensional environment to a human operator in accordance with an illustrative embodiment.

With reference next to FIG. 6, an illustration of a display of a three-dimensional environment to a human operator is depicted in accordance with an illustrative embodiment. Human operator 212 is focused on flight stick 316 shown in display 300 from the viewpoint of the eyes of avatar 302.

In illustrative this example, avatar 302 grips flight stick 316 with left hand 602 and right hand 502. Human operator 212 initiates a command to change dimensions for flight stick 316. In this illustrative example, the command may be verbal commands such that human operator 212 does not need to manipulate an input device and may focus on flight stick 316.

As depicted, human operator 212 moves left hand 602 in the direction of arrow 604. Further, human operator also moves right hand 502 in the direction of arrow 608. This movement, in essence, stretches flight stick 316. As a result, the dimensions of model 304 change and, in particular, the dimensions for flight stick 316 in model 304.

Figure 7:
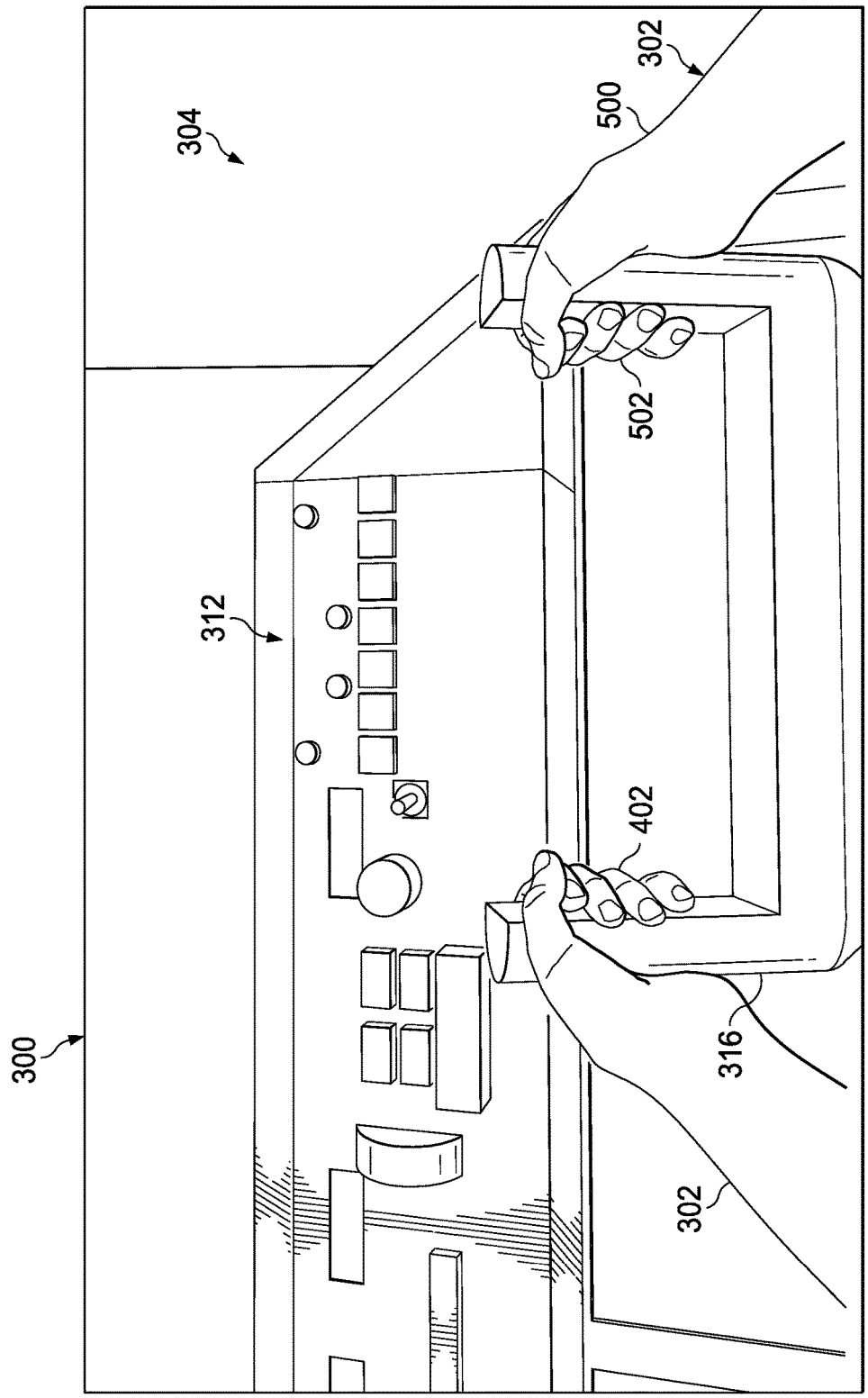
FIG. 7 is an illustration of a display of a three-dimensional environment to a human operator in accordance with an illustrative embodiment.

With reference next to FIG. 7, an illustration of a display of a three-dimensional environment to a human operator is depicted in accordance with an illustrative embodiment. In this illustration, flight stick 316 has changed in dimensions based on left hand 602 and right hand 502 pulling on flight stick 316.

These changes in dimensions in model 304 may be stored in the file containing model 304. As a result, the update to model 304 may be used for further testing, fabricating a prototype of the flight deck, manufacturing an actual flight deck in an aircraft, or other suitable operations in designing the flight deck.

Figure 8:
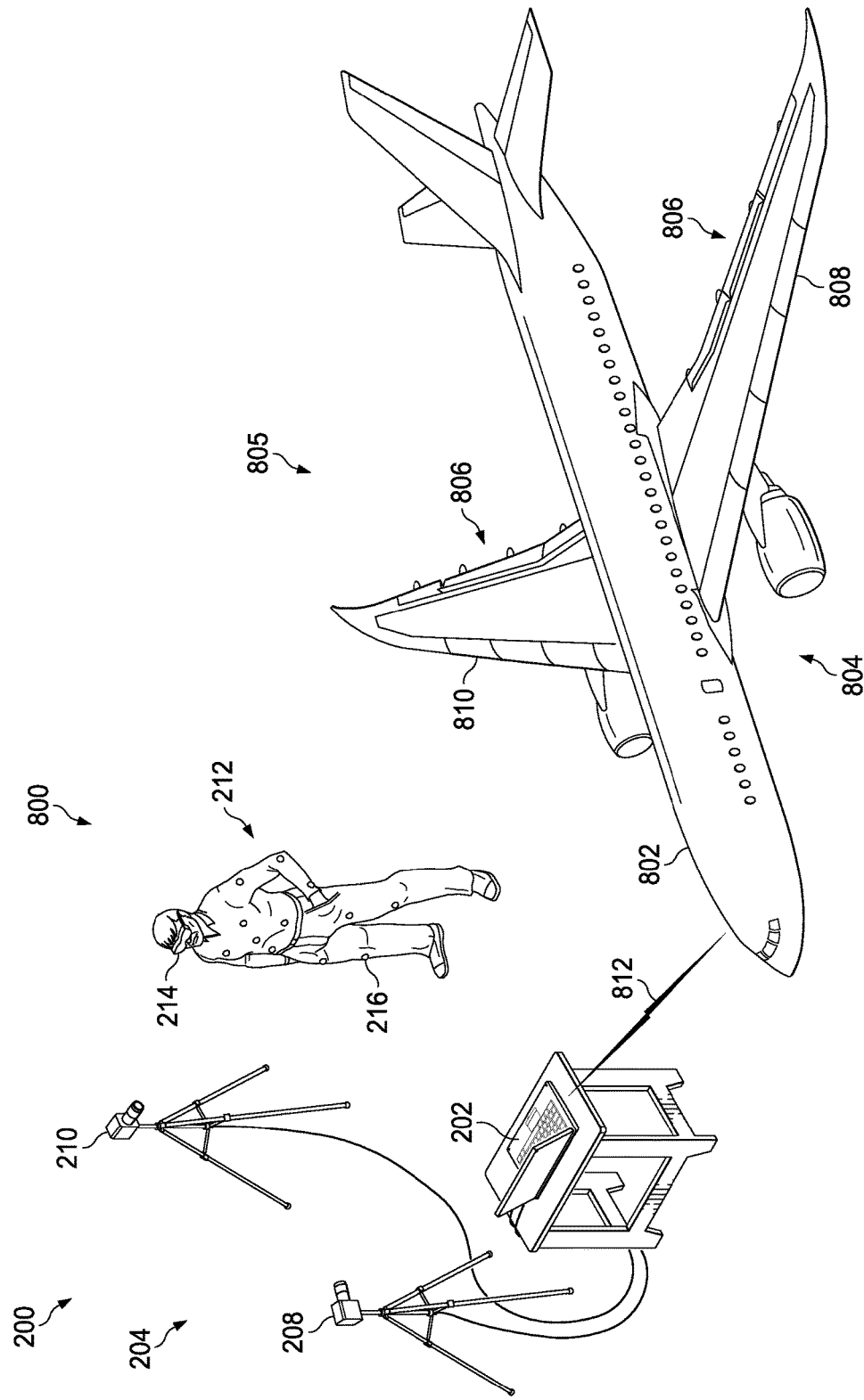
FIG. 8 is an illustration of a live environment in accordance with an illustrative embodiment.

With reference next to FIG. 8, an illustration of a live environment is depicted in accordance with an illustrative embodiment. In this illustrative example, object immersion environment 200 includes model manager 202, optical system 204, and human operator 212 in first location 800.

Additionally, aircraft 802 is shown in live environment 804 in second location 805. In this example, aircraft 802 includes a deformation sensor system in the form of strain gauges 806 on wing 808 and wing 810.

Strain gauges 806 measure deformation in wing 808 and wing 810. These measurements form live information that is sent to model manager 202 as quickly as possible without intentional delay during testing of aircraft 802. For example, live information is sent in real time from strain gauges 806 to model manager 202. The live information may be sent over wireless connection 812 from aircraft 802 to model manager 202.

Figure 9:
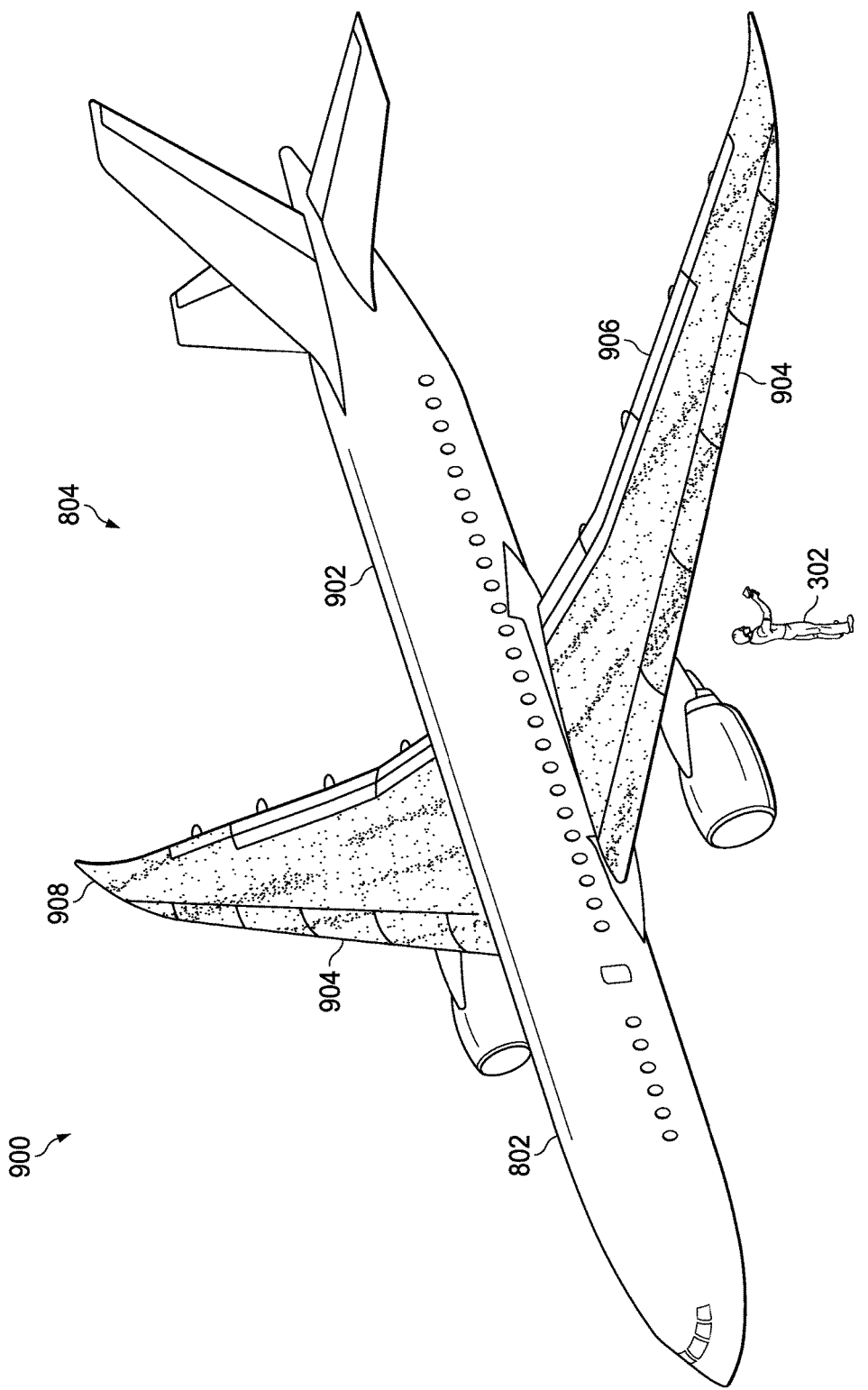
FIG. 9 is an illustration of a display of a three-dimensional environment to a human operator using live information in accordance with an illustrative embodiment.

With reference now to FIG. 9, an illustration of a display of a three-dimensional environment to a human operator using live information is depicted in accordance with an illustrative embodiment. Display 900 is an example of a display seen by human operator 212 on head-mounted display 214 in FIG. 8.

In this illustrative example, display 900 is a display of a three-dimensional environment generated by model manager 202 in FIG. 8 using live information generated in live environment 804 in FIG. 8. In this illustrative example, avatar 302 is shown in display 900 with model 902 of aircraft 802 in live environment 804.

As depicted, display 900 is from a viewpoint relative to avatar 302. The viewpoint in this example is from a point that is a distance away from avatar 302.

In this illustrative example, the live information is used to identify stress in wing 808 and wing 810 for aircraft in FIG. 8. As depicted, the stress is shown in display 900 using graphical indicators 904 on wing 906 and wing 908 in model 902 of aircraft 802.

As depicted, graphical indicators 904 take the form of colors. The colors for graphical indicators 904 show where stress has been identified from the live information. The color is used to indicate the amount of stress in this illustrative example. For example, the color blue indicates low stress, while the color red indicates high stress. The low stress may be stress that is within design tolerances, while the high stress may be a stress that is greater than a design tolerance for the wing.

Figure 10:
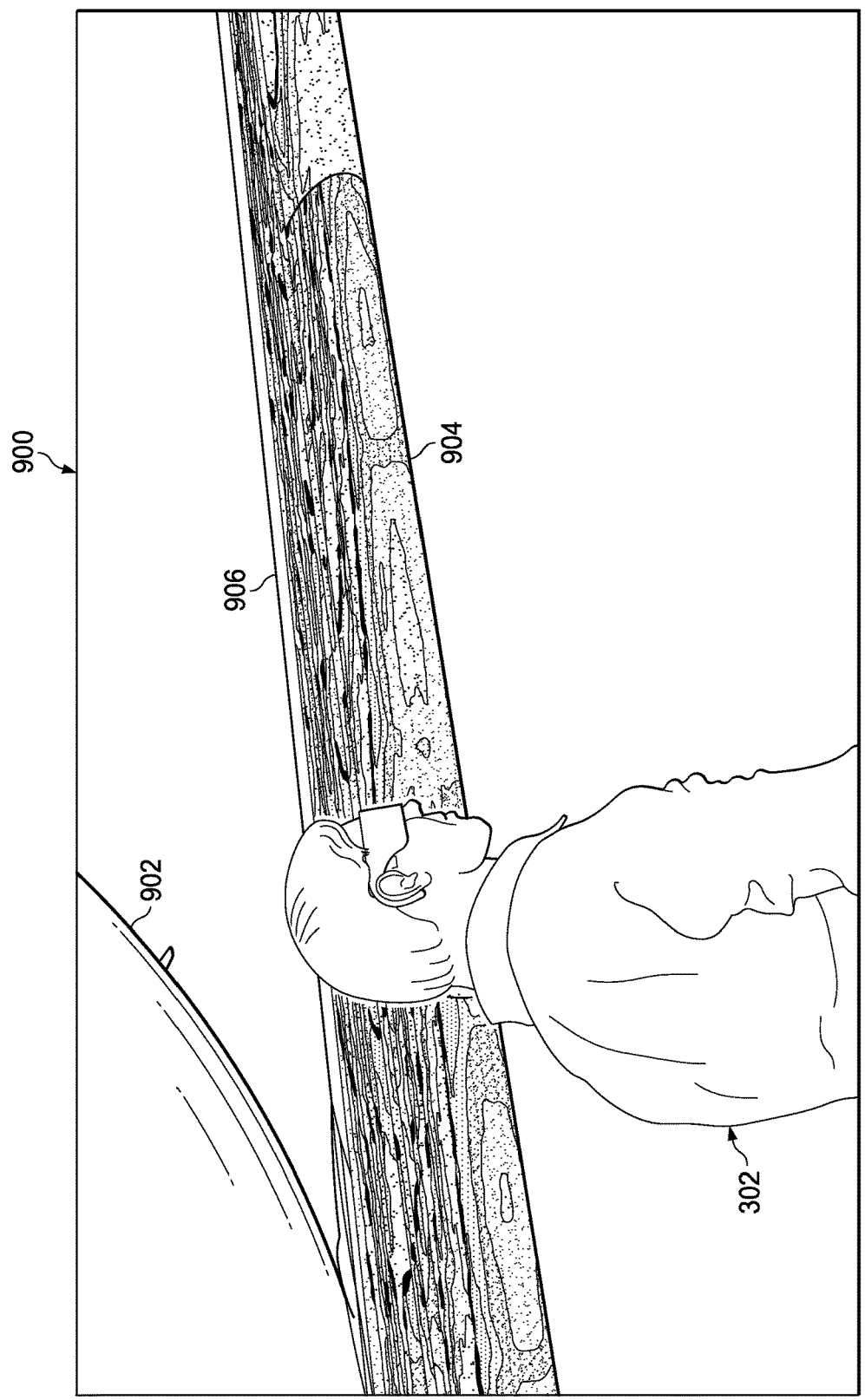
FIG. 10 is an illustration of a display of a three-dimensional environment to a human operator using live information in accordance with an illustrative embodiment.

Turning next to FIG. 10, an illustration of a display of a three-dimensional environment to a human operator using live information is depicted in accordance with an illustrative embodiment. In this example, human operator 212 has moved in a manner that caused avatar 302 to move towards wing 906. Display 900 changes to an enlarged view of a portion of wing 906 based on movement of avatar 302 closer to wing 906 in model 902 of aircraft 802.

Figure 11:
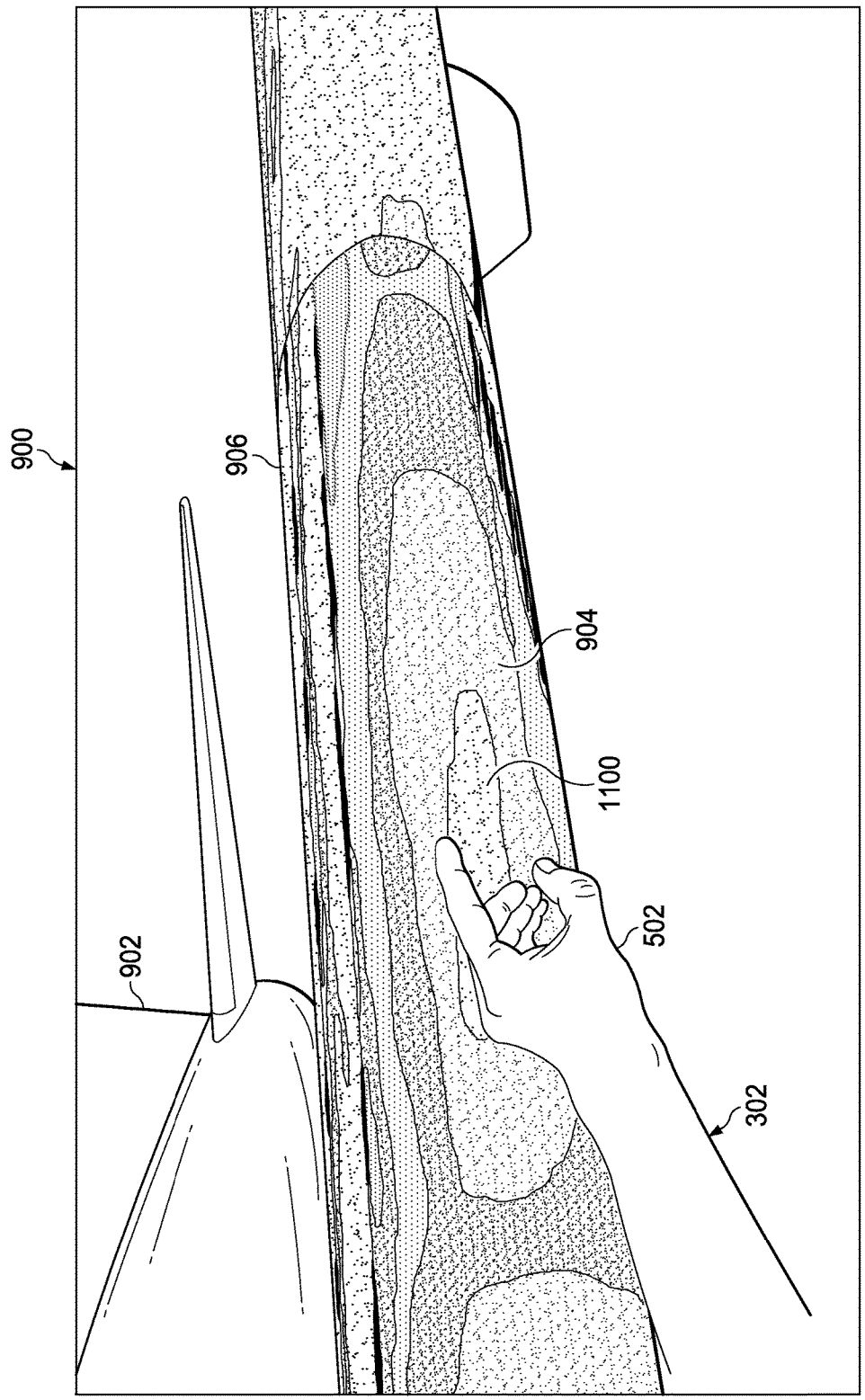
FIG. 11 is an illustration of a display of a three-dimensional environment to a human operator in accordance with an illustrative embodiment.

With reference now to FIG. 11, an illustration of a display of a three-dimensional environment to a human operator is depicted in accordance with an illustrative embodiment. In this figure, display 900 is from a first person viewpoint from the eyes of avatar 302.

As depicted, human operator 212 may view the stress through graphical indicators 904. Human operator 212 may view this information when examining the actual object under test if examining the object under stress in person may be infeasible or does not have a desired level of safety.

Further, if other operators are viewing the three-dimensional environment, human operator 212 may point to the location, such as location 1100, as the location of interest based on viewing graphical indicators 904. In this example, human operator 212 points to location 1100 through motions that translate into right hand 502 pointing to location 1100. In another illustrative example, human operator 212 may graphically mark location 1100 for additional analysis. The marking may be made through highlighting, coloring, a graphic, text, or some other suitable marking mechanism.

The illustration of the object immersion environment and the live environment in FIGS. 2-11 have been provided for purposes of illustrating one illustrative example. The illustrations are not meant to limit the manner in which other illustrative examples may be implemented. For example, other types of display systems may be used instead of a head-mounted display. Examples of other types of display systems include a display monitor, a holographic display system, or some other suitable type of display system that may be used depending on the implementation and the desired level of immersion for a human operator.

As another example, the human operator may also use tactile feedback devices. For example, the human operator may wear cyber gloves that provide a force feedback to the human operator when interacting with an object. This type of feedback may provide increased immersion into the three-dimensional environment with the object.

In still other illustrative examples, the objects may be platforms other than an aircraft. For example, the objects may be a consumer electronic device, an office, or some other suitable type of object for which object immersion is desired. In yet another example, marker suit 216 may be omitted when features on human operator 212 are used in place of actual markers.

In still another illustrative example, other types of parameters other than stress may be shown for model 902 of aircraft 802. For example, temperature may be shown in addition to or in place of stress.

Figure 12:
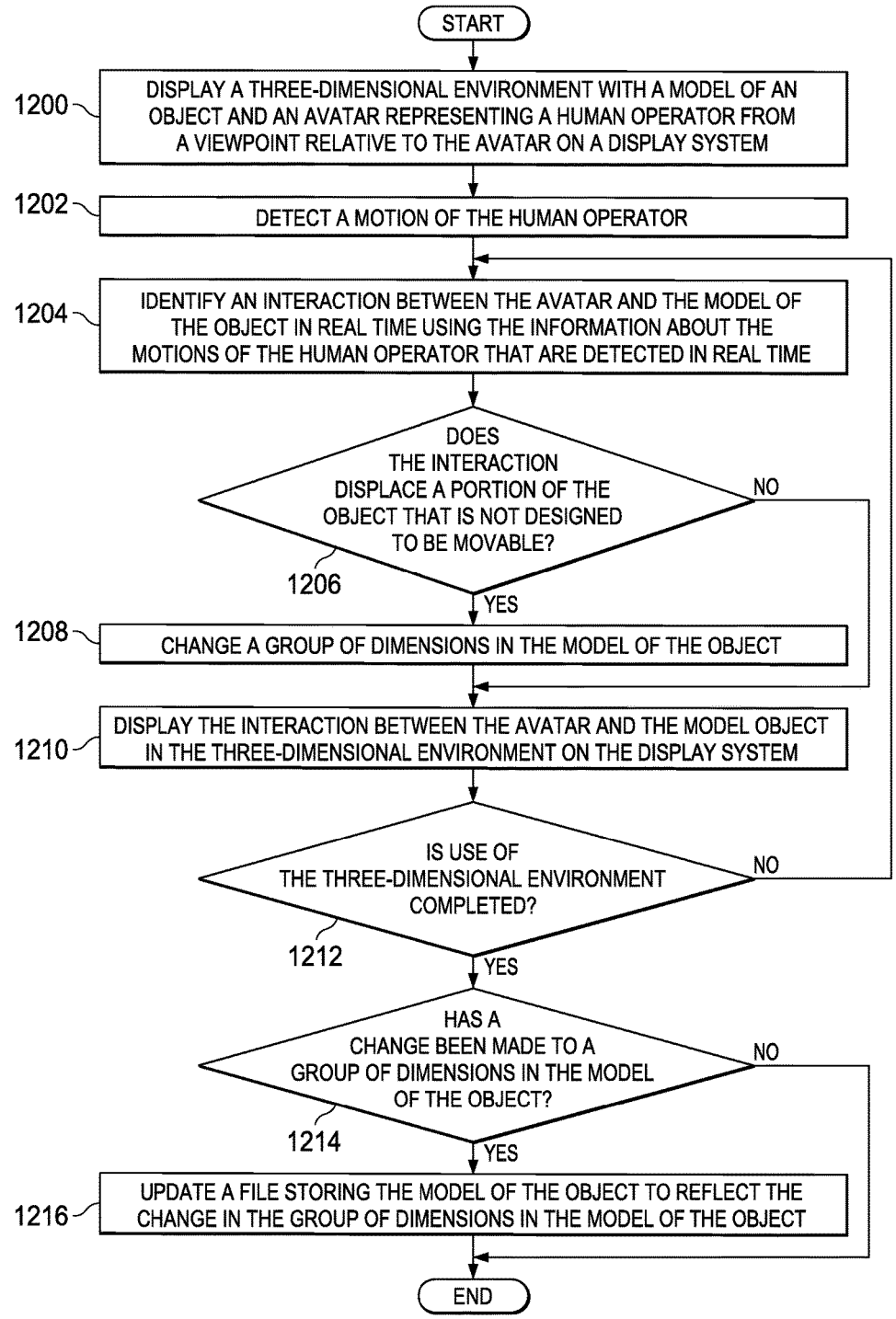
FIG. 12 is an illustration of a flowchart of a process for managing an object in accordance with an illustrative embodiment.

Turning next to FIG. 12, an illustration of a flowchart of a process for managing an object is depicted in accordance with an illustrative embodiment. The process illustrated in FIG. 12 may be implemented in object immersion environment 100 in FIG. 1. In particular, the process may be implemented using model manager 106 in object management system 108.

The process begins by displaying a three-dimensional environment with a model of an object and an avatar representing a human operator from a viewpoint relative to the avatar on a display system (operation 1200). The process detects a motion of the human operator (operation 1202). The process identifies an interaction between the avatar and the model of the object in real time using the information about the motions of the human operator that are detected in real time (operation 1204).

A determination is made as to whether the interaction displaces a portion of the object that is not designed to be movable (operation 1206). If the interaction moves a portion of an object not designed to be movable, the interaction is a displacement.

If the interaction displaces a portion of the object, a group of dimensions in the model of the object is changed (operation 1208). The process displays the interaction between the avatar and the model object in the three-dimensional environment on the display system (operation 1210). With reference again to operation 1206, if the interaction moves a portion of the object that is designed to be movable, the process proceeds directly to operation 1210 from operation 1206. In this case, a group of dimensions in the model of the object are not changed.

A determination is made as to whether use of the three-dimensional environment is completed (operation 1212). If the use of the three-dimensional environment is not completed, the process returns to operation 1204.

Otherwise, the process determines whether a change has been made to a group of dimensions in the model of the object (operation 1214). If a change has been made to the group of dimensions of the model of the object, the process updates a file storing the model of the object such that the file reflects the change in the group of dimensions in the model of the object (operation 1216) with the process terminating thereafter. Otherwise, the process terminates without updating the file.

Figure 13:
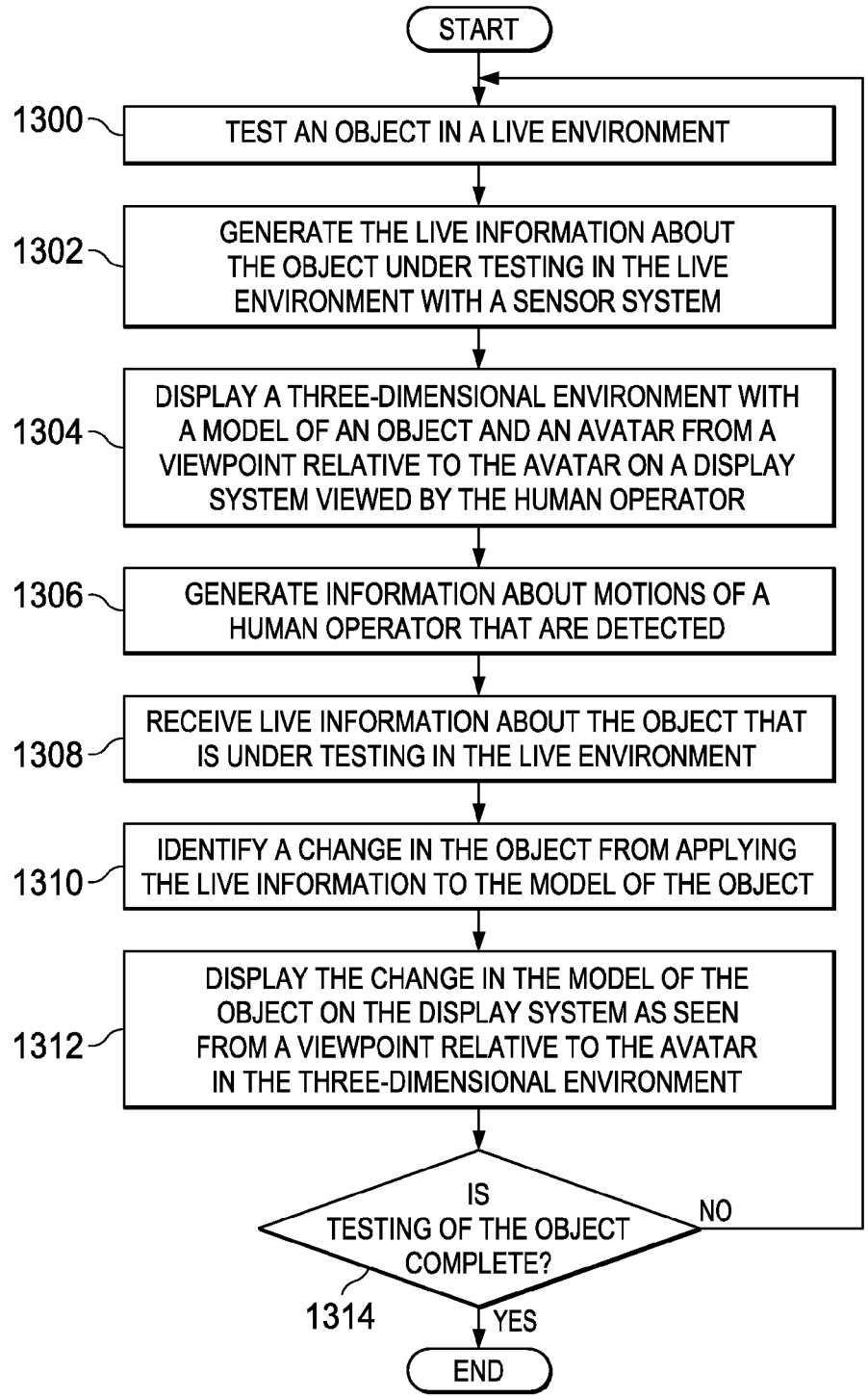
FIG. 13 is an illustration of a flowchart of a process for testing an object in accordance with an illustrative embodiment.

Turning now to FIG. 13, an illustration of a flowchart of a process for testing an object is depicted in accordance with an illustrative embodiment. The process illustrated in FIG. 13 may be implemented using object immersion environment 100 and live environment 146 in FIG. 1. In particular, one or more operations in this flowchart may be implemented using model manager 106.

The process begins by testing an object in a live environment (operation 1300). The process generates the live information about the object under testing in the live environment with a sensor system (operation 1302).

The process displays a three-dimensional environment with a model of an object and an avatar from a viewpoint relative to the avatar on a display system viewed by the human operator (operation 1304). The process generates information about motions of a human operator that are detected (operation 1306). The process receives live information about the object that is under testing in the live environment (step 1308).

The process identifies a change in the object from applying the live information to the model of the object (operation 1310). The process displays the change in the model of the object on the display system as seen from a viewpoint relative to the avatar in the three-dimensional environment (operation 1312). In this example, operation 1312 may comprise displaying a group of colors on the model of the object as seen from the point of view relative to the avatar in which the group of colors indicates amounts of stress for the object.

A determination is made as to whether testing of the object is complete (operation 1314). If the testing is completed, the process is terminated. Otherwise, the process returns to operation 1300.

With the process in FIG. 13, change in a test process used in testing the object may be made based on the change identified in the object as seen from the viewpoint of the avatar. The change in the test process is performed during a time selected from at least one of during a test of the object or after the test of the object. In this manner, more efficient testing may occur.

The increased efficiency in testing may result in performing additional tests during the testing session if a determination is made that the initial test is completed as desired. In another illustrative example, a particular test may be halted if the change displayed for the model indicates that an undesired result may occur. For example, the undesired result may be an inconsistency being introduced into the object. For example, if the object is an aircraft, and a bank angle changing at a particular rate indicates that a wing of the aircraft may begin to incur inconsistencies such as delamination or fractures, that maneuver may be halted. In a similar fashion, if forces are applied to a composite wing in a laboratory, the display of the change in the model of the composite wing may indicate that the amount of stress may cause delamination in the composite wing. The test may then be halted prior to delamination occurring in the composite wing. In this manner, further testing may be performed without fabricating another composite wing.

Figure 14:
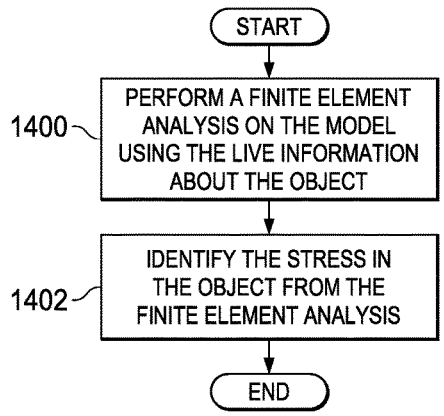
FIG. 14 is an illustration of a flowchart of a process for identifying a change in an object from applying live information in accordance with an illustrative embodiment.

With reference next to FIG. 14, an illustration of a flowchart of a process for identifying a change in an object from applying live information is depicted in accordance with an illustrative embodiment. The process in FIG. 14 is an example of one implementation for operation 1310 in FIG. 13. In this example, the change is a displacement in the object being tested.

The process begins by performing a finite element analysis on the model using the live information about the object (operation 1400). The process identifies the stress in the object from the finite element analysis (step 1402) with the process terminating thereafter.

Figure 15:
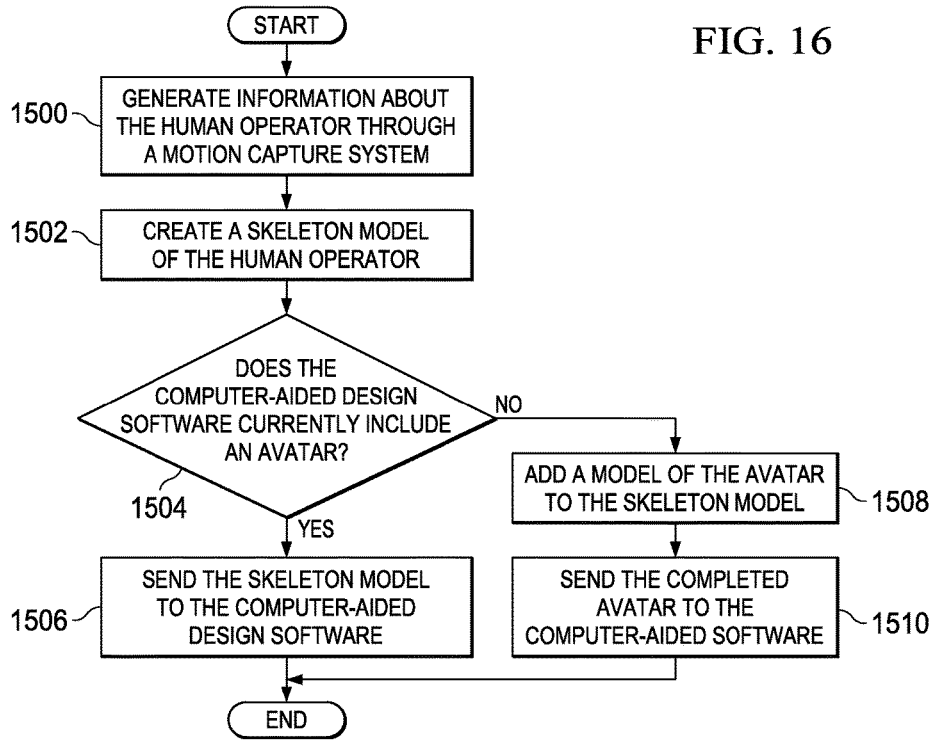
FIG. 15 is an illustration of a flowchart of a process for placing an avatar into computer-aided design software in accordance with an illustrative embodiment.

With reference next to FIG. 15, an illustration of a flowchart of a process for placing an avatar into computer-aided design software is depicted in accordance with an illustrative embodiment. The process illustrated in FIG. 15 may be used to add avatar 118 in FIG. 1 into three-dimensional environment 112 when three-dimensional environment 112 is generated by computer-aided design system 144.

The process begins by generating information about the human operator through a motion capture system (operation 1500). The information may include at least one of the location of features or markers on the human operator in three dimensions.

The process creates a skeleton model of the human operator (operation 1502). The skeleton model includes an identification of joint locations and dimensions that are substantially the same as the human operator in this example.

A determination is made as to whether the computer-aided design software currently includes an avatar (operation 1504). If the computer-aided design software currently includes an avatar, the skeleton model is sent to the computer-aided design software (operation 1506) with the process terminating thereafter.

If an avatar is not available in the computer-aided design software, the process adds a model of the avatar to the skeleton model (operation 1508). The model includes a mesh for skin and attachments such as clothing and items that may be worn by the avatar or otherwise attached to the avatar. In operation 1508, a mesh for the avatar is placed onto the skeleton model to form the avatar. The process then sends the completed avatar to the computer-aided software (operation 1510) with the process terminating thereafter. In this manner, an avatar representing the human operator may be added for use with the computer-aided design software.

Figure 16:
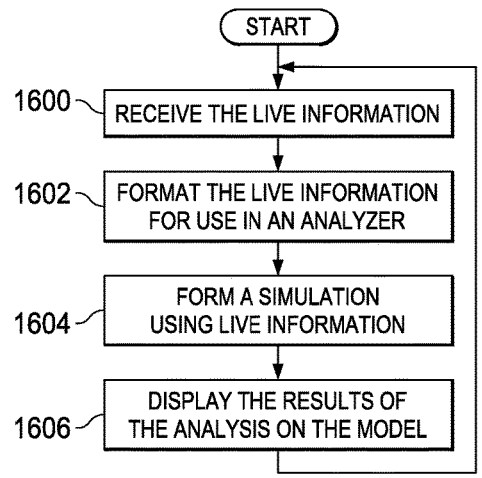
FIG. 16 is an illustration of a flowchart of a process for applying live information to a model in accordance with an illustrative embodiment.

With reference now to FIG. 16, an illustration of a flowchart of a process for applying live information to a model is depicted in accordance with an illustrative embodiment. The process illustrated in FIG. 16 may be implemented in model manager 106.

The process begins by receiving the live information (operation 1600). Thereafter, the process formats the live information for use in an analyzer (operation 1602). In operation at 1602, the analyzer may be, for example, the finite element analysis process or some other suitable type of analysis process. In the illustrative example, currently used analysis processes may be used with the live data formatted for use by the process. Thereafter, the process forms a simulation using live information (operation 1604). The process then displays the results of the analysis on the model (operation 1606) with the process returning to operation 1600.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams. When implemented as a combination of program code and hardware, the implementation may take the form of firmware.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

For example, the process in FIG. 12 enables a human operator to make design changes to the model of the object. As a further enhancement, the process in FIG. 12 may include operations in which live information is displayed. For example, the process may receive live information from an environment of intended use for the object, identify a change in the model from applying the live information to the model of the object, and display the change in the model of the object in the three-dimensional environment. In another illustrative example, in FIG. 13, operation 1300 and operation 1302 may be performed at substantially the same time as operation 1304 and 1306.

Figure 17:
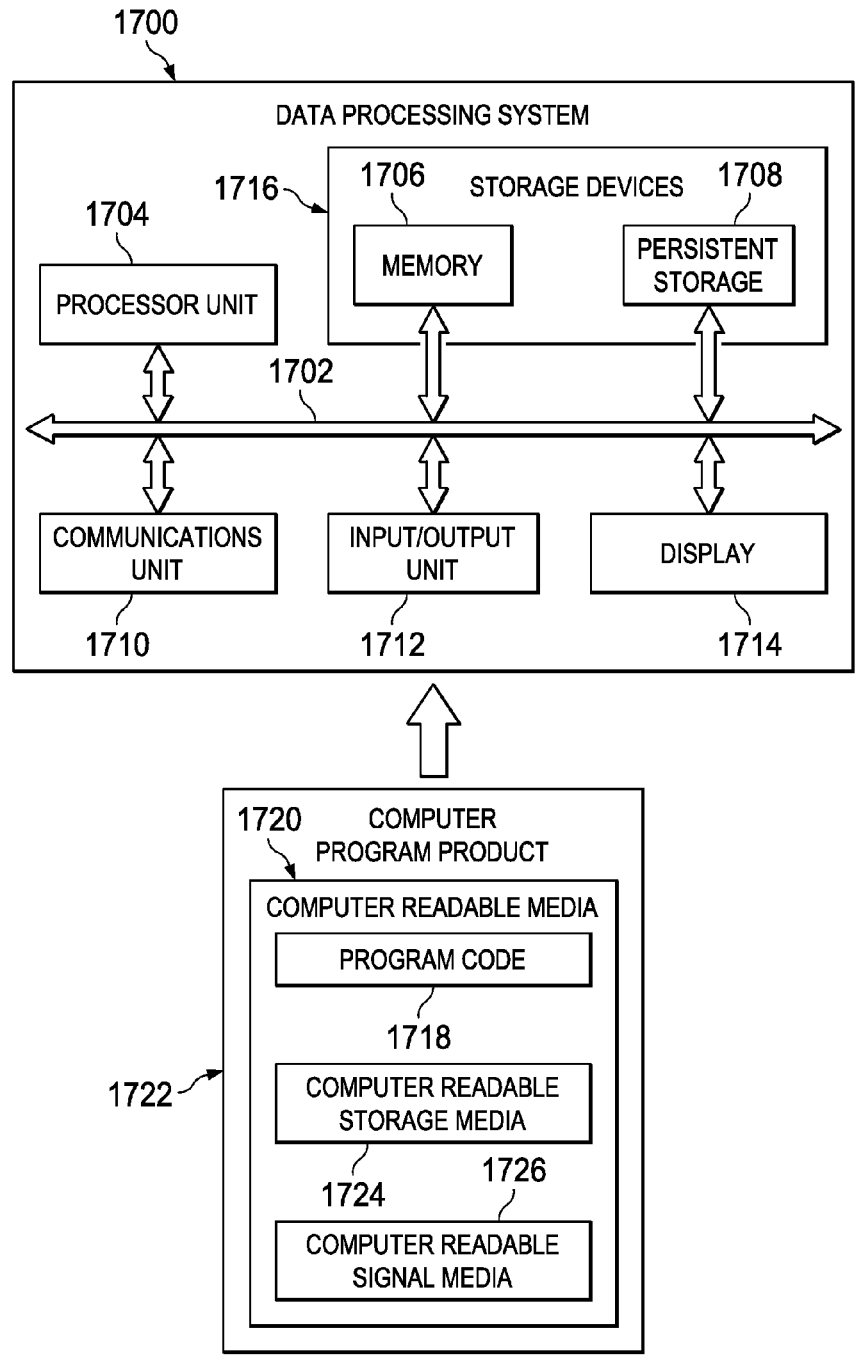
FIG. 17 is an illustration of a block diagram of a data processing system in accordance with an illustrative embodiment.

Turning now to FIG. 17, an illustration of a block diagram of a data processing system is depicted in accordance with an illustrative embodiment. Data processing system 1700 may be used to implement computer system 110 in FIG. 1. In this illustrative example, data processing system 1700 includes communications framework 1702, which provides communications between processor unit 1704, memory 1706, persistent storage 1708, communications unit 1710, input/output (I/O) unit 1712, and display 1714. In this example, communication framework may take the form of a bus system.

Processor unit 1704 serves to execute instructions for software that may be loaded into memory 1706. Processor unit 1704 may be a number of processors, a multi-processor core, or some other type of processor, depending on the particular implementation.

Memory 1706 and persistent storage 1708 are examples of storage devices 1716. A storage device is any piece of hardware that is capable of storing information, such as, for example, without limitation, at least one of data, program code in functional form, or other suitable information either on a temporary basis, a permanent basis, or both on a temporary basis and a permanent basis. Storage devices 1716 may also be referred to as computer-readable storage devices in these illustrative examples. Memory 1706, in these examples, may be, for example, a random access memory or any other suitable volatile or non-volatile storage device. Persistent storage 1708 may take various forms, depending on the particular implementation.

For example, persistent storage 1708 may contain one or more components or devices. For example, persistent storage 1708 may be a hard drive, a flash memory, a rewritable optical disk, a rewritable magnetic tape, or some combination of the above. The media used by persistent storage 1708 also may be removable. For example, a removable hard drive may be used for persistent storage 1708.

Communications unit 1710, in these illustrative examples, provides for communications with other data processing systems or devices. In these illustrative examples, communications unit 1710 is a network interface card.

Input/output unit 1712 allows for input and output of data with other devices that may be connected to data processing system 1700. For example, input/output unit 1712 may provide a connection for user input through at least one of a keyboard, a mouse, or some other suitable input device. Further, input/output unit 1712 may send output to a printer. Display 1714 provides a mechanism to display information to a user.

Instructions for at least one of the operating system, applications, or programs may be located in storage devices 1716, which are in communication with processor unit 1704 through communications framework 1702. The processes of the different embodiments may be performed by processor unit 1704 using computer-implemented instructions, which may be located in a memory, such as memory 1706.

These instructions are referred to as program code, computer-usable program code, or computer-readable program code that may be read and executed by a processor in processor unit 1704. The program code in the different embodiments may be embodied on different physical or computer-readable storage media, such as memory 1706 or persistent storage 1708.

Program code 1718 is located in a functional form on computer-readable media 1720 that is selectively removable and may be loaded onto or transferred to data processing system 1700 for execution by processor unit 1704. Program code 1718 and computer-readable media 1720 form computer program product 1722 in these illustrative examples. In one example, computer-readable media 1720 may be computer-readable storage media 1724 or computer-readable signal media 1726. In these illustrative examples, computer-readable storage media 1724 is a physical or tangible storage device used to store program code 1718, rather than a medium that propagates or transmits program code 1718.

Alternatively, program code 1718 may be transferred to data processing system 1700 using computer-readable signal media 1726. Computer-readable signal media 1726 may be, for example, a propagated data signal containing program code 1718. For example, computer-readable signal media 1726 may be at least one of an electromagnetic signal, an optical signal, or any other suitable type of signal. These signals may be transmitted over at least one of communications links, such as wireless communications links, an optical fiber cable, a coaxial cable, a wire, or any other suitable type of communications link.

The different components illustrated for data processing system 1700 are not meant to provide architectural limitations to the manner in which different embodiments may be implemented. The different illustrative embodiments may be implemented in a data processing system including components in addition to or in place of those illustrated for data processing system 1700. Other components shown in FIG. 17 can be varied from the illustrative examples shown. The different embodiments may be implemented using any hardware device or system capable of running program code 1718.

Figure 18:
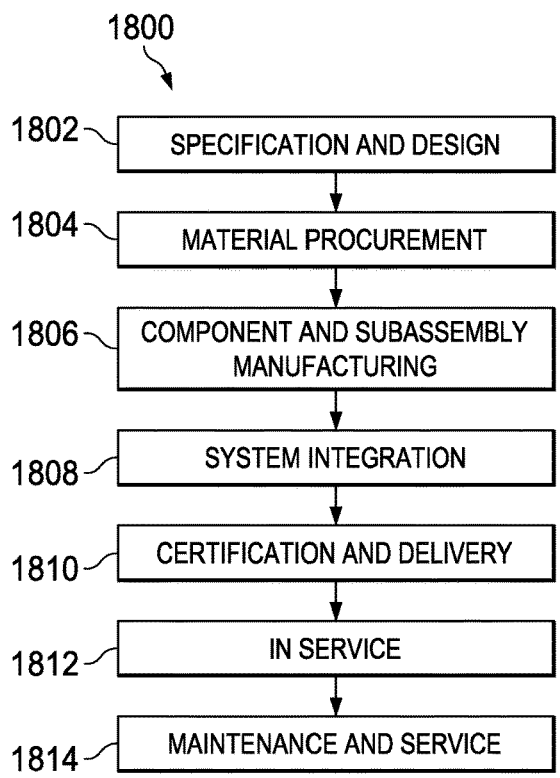
FIG. 18 is an illustration of a block diagram of an aircraft manufacturing and service method in accordance with an illustrative embodiment.
Figure 19:
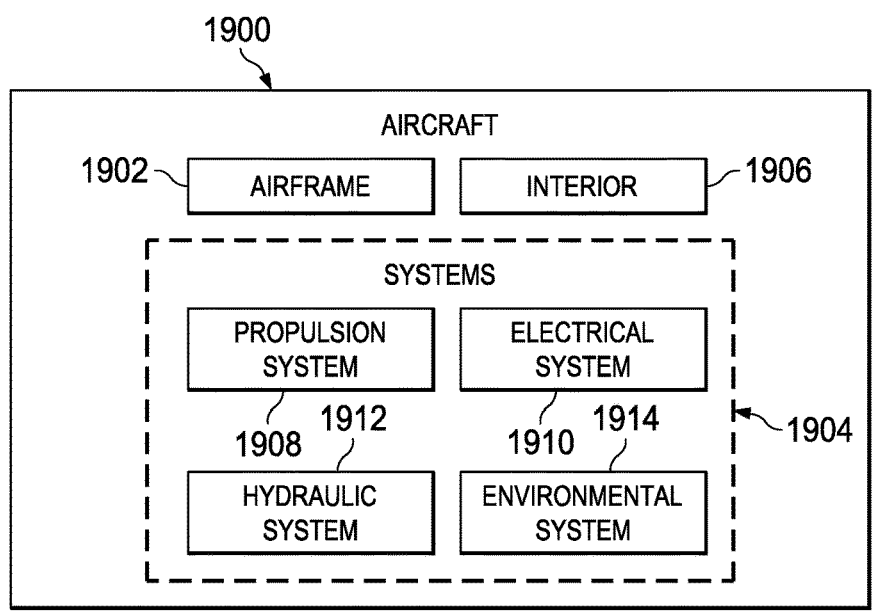
FIG. 19 is an illustration of a block diagram of an aircraft in accordance with an illustrative embodiment.

Illustrative embodiments of the disclosure may be described in the context of aircraft manufacturing and service method 1800 as shown in FIG. 18 and aircraft 1900 as shown in FIG. 19. Turning first to FIG. 18, an illustration of a block diagram of an aircraft manufacturing and service method is depicted in accordance with an illustrative embodiment. During pre-production, aircraft manufacturing and service method 1800 may include specification and design 1802 of aircraft 1900 and material procurement 1804.

During production, component and subassembly manufacturing 1806 and system integration 1808 of aircraft 1900 takes place. Thereafter, aircraft 1900 may go through certification and delivery 1810 in order to be placed in service 1812. While in service 1812 by a customer, aircraft 1900 in is scheduled for routine maintenance and service 1814, which may include modification, reconfiguration, refurbishment, and other maintenance or service.

Each of the processes of aircraft manufacturing and service method 1800 may be performed or carried out by a system integrator, a third party, an operator, or some combination thereof. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 19, an illustration of a block diagram of an aircraft is depicted in which an illustrative embodiment may be implemented. In this example, aircraft 1900 is produced by aircraft manufacturing and service method 1800 in FIG. 18 and may include airframe 1902 with a plurality of systems 1904 and interior 1906. Examples of systems 1904 include one or more of propulsion system 1908, electrical system 1910, hydraulic system 1912, and environmental system 1914. Any number of other systems may be included. Although an aerospace example is shown, different illustrative embodiments may be applied to other industries, such as the automotive industry. Apparatuses and methods embodied herein may be employed during at least one of the stages of aircraft manufacturing and service method 1800.

As yet another example, one or more apparatus embodiments, method embodiments, or a combination thereof may be utilized during design and production stages. For example, model manager 106 in FIG. 1 may be used to create and refine a design of aircraft 1900 in which the design is represented by a model, such as a computer-aided design model. The model may be updated using model manager 106 during component and subassembly manufacturing 1806 and system integration 1808 based on information received during these stages.

One or more apparatus embodiments, method embodiments, or a combination thereof may be utilized while aircraft 1900 is in service 1812 in FIG. 18, during maintenance and service 1814, or both. For example, model manager 106 may be used to change the design of parts needed during maintenance of aircraft 1900. The use of a number of the different illustrative embodiments may substantially expedite the assembly of aircraft 1900, reduce the cost of aircraft 1900, or both expedite the assembly of aircraft 1900 and reduce the cost of aircraft 1900.

Figure 20:
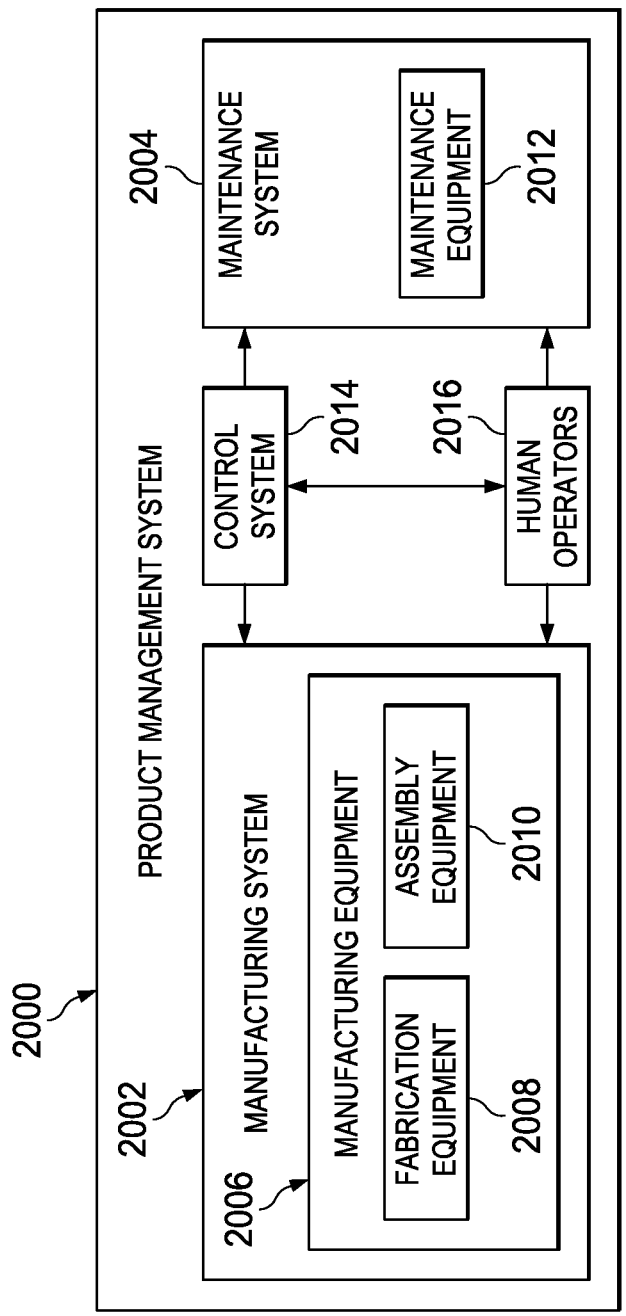
FIG. 20 is an illustration of a block diagram of a product management system in accordance with an illustrative embodiment.

Turning now to FIG. 20, an illustration of a block diagram of a product management system is depicted in accordance with an illustrative embodiment. Product management system 2000 is a physical hardware system. In this illustrative example, product management system 2000 may include at least one of manufacturing system 2002 or maintenance system 2004. In the illustrative example, object management system 108 in FIG. 1 may be used with product management system 2000 to produce objects, such as aircraft 1900 in FIG. 19.

Manufacturing system 2002 is configured to manufacture objects or products, such as aircraft 1900. As depicted, manufacturing system 2002 includes manufacturing equipment 2006. Manufacturing equipment 2006 includes at least one of fabrication equipment 2008 or assembly equipment 2010.

Fabrication equipment 2008 is equipment that may be used to fabricate components for parts used to form aircraft 1900. For example, fabrication equipment 2008 may include machines and tools. These machines and tools may be at least one of a drill, a hydraulic press, a furnace, a mold, a composite tape laying machine, a vacuum system, a lathe, or other suitable types of equipment. Fabrication equipment 2008 may be used to fabricate at least one of metal parts, composite parts, semiconductors, circuits, fasteners, ribs, skin panels, spars, antennas, or other suitable types of parts.

Assembly equipment 2010 is equipment used to assemble parts to form aircraft 1900. In particular, assembly equipment 2010 may be used to assemble components and parts to form aircraft 1900. Assembly equipment 2010 also may include machines and tools. These machines and tools may be at least one of a robotic arm, a crawler, a faster installation system, a rail-based drilling system, a robot, or other suitable types of equipment. Assembly equipment 2010 may be used to assemble parts such as seats, horizontal stabilizers, wings, engines, engine housings, landing gear systems, and other parts for aircraft 1900.

In this illustrative example, maintenance system 2004 includes maintenance equipment 2012. Maintenance equipment 2012 may include any equipment needed to perform maintenance on aircraft 1900. Maintenance equipment 2012 may include tools for performing different operations on parts on aircraft 1900. These operations may include at least one of disassembling parts, refurbishing parts, inspecting parts, reworking parts, manufacturing placement parts, or other operations for performing maintenance on aircraft 1900. These operations may be for routine maintenance, inspections, upgrades, refurbishment, or other types of maintenance operations.

In the illustrative example, maintenance equipment 2012 may include ultrasonic inspection devices, x-ray imaging systems, vision systems, drills, crawlers, or other suitable devices. In some cases, maintenance equipment 2012 may include fabrication equipment 2008, assembly equipment 2010, or both to produce and assemble parts that may be needed for maintenance.

Product management system 2000 also includes control system 2014. Control system 2014 is a hardware system, and may also include software or other types of components. Control system 2014 is configured to control the operation of at least one of manufacturing system 2002 or maintenance system 2004. For example, control system 2014 may control operation of manufacturing system 2002 using model 104 in FIG. 1. In particular, control system 2014 may control the operation of at least one of fabrication equipment 2008, assembly equipment 2010, or maintenance equipment 2012 using model 104.

In the illustrative example, object management system 108, including model manager 106, may communicate with control system 2014 as part of a process to manufacture objects, such as aircraft 1900 or parts of aircraft 1900. Model manager 106 in FIG. 1 may allow for changes in the design of aircraft 1900 to be made more quickly and more efficiently with less cost, and send model 104 to control system 2014 for use in manufacturing or performing maintenance for aircraft 1900. A design for aircraft 1900 may be supplied to control system 2014 to manufacture aircraft 1900 or parts for aircraft 1900 by manufacturing system 2002. Also, adjustments to aircraft 1900 may be identified in model 104 for use in maintenance system 2004 using model manager 106.

The hardware in control system 2014 may use hardware that may include computers, circuits, networks, and other types of equipment. The control may take the form of direct control of manufacturing equipment 2006. For example, robots, computer-controlled machines, and other equipment may be controlled by control system 2014. In other illustrative examples, control system 2014 may manage operations performed by human operators 2016 in manufacturing or performing maintenance on aircraft 1900. For example, control system 2014 may assign tasks, provide instructions, display models, or perform other operations to manage operations performed by human operators 2016. In these illustrative examples, model manager 106 in FIG. 1 may be in communication with or may be implemented in control system 2014 to manage at least one of the manufacturing or maintenance of aircraft 1900.

In the different illustrative examples, human operators 2016 may operate or interact with at least one of manufacturing equipment 2006, maintenance equipment 2012, or control system 2014. This interaction may be performed to manufacture aircraft 1900.

Of course, product management system 2000 may be configured to manage other products other than aircraft 1900. Although aircraft management system 2000 has been described with respect to manufacturing in the aerospace industry, aircraft management system 2000 may be configured to manage products for other industries. For example, aircraft management system 2000 may be configured to manufacture products for the automotive industry as well as any other suitable industries.

Thus, one or more of the illustrative examples provide one or more technical solutions that overcome a technical problem with managing design changes in models of objects. As a result, one or more technical solutions using model manager 106 may provide a technical effect of reducing time needed to make design changes in models of objects. As depicted, model manager 106 may be used to provide immersion into a virtual reality environment that allows for ergonomic testing. Further, changes to a design of an object during this testing or for other reasons may be made by the human operator making motions translated into those of the avatar to change dimensions in the model of the object.

In yet another illustrative example, live information may be obtained from testing of the object in a live environment. This data may be received in real time such that changes in the testing procedures may occur while the testing is in progress. In this manner, the time and expense needed to test objects may be reduced and additional tests may be avoided by changing the current test. For example, parameters to be tested in a second test may be during the first test if the first test is successful in time, and resources designated for the first test are still present for testing the object.

The description of the different illustrative embodiments has been presented for purposes of illustration and description, and is not intended to be exhaustive or limited to the embodiments in the form disclosed. The different illustrative examples describe components that perform actions or operations. In an illustrative embodiment, a component may be configured to perform the action or operation described. For example, the component may have a configuration or design for a structure that provides the component an ability to perform the action or operation that is described in the illustrative examples as being performed by the component.

Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An object management system comprising:
    a model manager having:
        at least one storage device for storing program code; and
        at least one processor for processing the program code to:
        create an avatar representing a human operator;
        place the avatar in a three-dimensional environment with a model of an object;
        display the three-dimensional environment with the model of the object and the avatar from a viewpoint relative to the avatar on a display system;
        identify an interaction between the avatar and the model of the object in real time using information about motions of the human operator detected in real time from a motion capture system;
        determine whether the interaction constitutes a design change in the model of the object; and
        implement the design change in the model of the object in response to determining that the interaction constitutes a design change in the model of the object thereby enabling the human operator to make design changes in the model of the object using the avatar; and
        wherein the object is an aircraft, and wherein the interaction tests a usability of controls in the aircraft and wherein the interaction constitutes a design change in the model of the object if the interaction displaces a portion of the controls of the aircraft that is not designed to be moveable.

2. The object management system of claim 1, wherein the model manager updates a file storing the model of the object such that the file reflects a change in a group of dimensions corresponding to the design change in the model of the object in response to determining that the interaction constitutes a design change in the model of the object.

3. The object management system of claim 1, wherein the interaction is selected from one of moving a portion of the model of the object or displacing the portion of the model of the object.

4. The object management system of claim 1, wherein the avatar has dimensions of a person that performs ergonomic testing of the object.

5. The object management system of claim 1, wherein the model manager:
    receives live information from a live environment in which the object is located;
    identifies an effect of the live information on the model of the object based on the live information; and
    displays the effect on the model of the object in the three-dimensional environment.

6. The object management system of claim 5, wherein the live information includes at least one of modulation data, temperature, acceleration, velocity, translation, vibration data, force, or acoustic data.

7. The object management system of claim 1 further comprising:
    a manufacturing system that manufactures objects; and
    a control system that controls operation of the manufacturing system using the model.

8. The object management system of claim 1, wherein the three-dimensional environment is selected from one of a virtual reality environment and an augmented reality environment.

9. The object management system of claim 1, wherein the display system is selected from at least one of a display device, a computer monitor, glasses, a head-mounted display device, a tablet computer, a mobile phone, a projector, a heads-up display, a holographic display system, or a virtual retinal display.

10. The object management system of claim 1, wherein the model is selected from one of a computer-aided design model, a finite element method model, and a computer-aided model.

11. The object management system of claim 1, wherein the interaction constitutes a design change in the model of the object if the interaction displaces a portion of the model of the object that is not designed to be movable.

12. A method for managing an object, the method comprising:
    displaying a three-dimensional environment with a model of the object and an avatar representing a human operator from a viewpoint relative to the avatar on a display system;
    detecting a motion of the human operator;

identifying an interaction between the avatar and the model of the object in real time using information about motions of the human operator that are detected in real time;

determining whether the interaction constitutes a design change in the model of the object; and implementing the design change in the model of the object in response to determining that the interaction constitutes a design change in the model of the object thereby enabling design changes in the model of the object made by the human operator; and wherein the object is an aircraft, and wherein the interaction tests a usability of controls in the aircraft and wherein the interaction constitutes a design change in the model of the object if the interaction displaces a portion of the controls of the aircraft that is not designed to be moveable.

13. The method of claim 12, wherein the interaction changes a group of dimensions in the model of the object in response to determining that the interaction constitutes a design change in the model of the object and further comprises:

updating a file storing the model of the object such that the file reflects a change in the group of dimensions in the model of the object.

14. The method of claim 12, wherein the interaction is selected from one of moving a portion of the model of the object or displacing the portion of the model of the object.

15. The method of claim 12, wherein the avatar has dimensions of a person that performs ergonomic testing of the object.

16. The method of claim 12 further comprising:

receiving live information from an environment in which the object is located;

identifying a change in the model of the object from applying the live information to the model of the object; and displaying the change in the model of the object in the three-dimensional environment.

17. The method of claim 16, wherein the live information includes at least one of modulation data, temperature, acceleration, velocity, translation, vibration data, force, or acoustic data.

18. The method of claim 12 further comprising:

manufacturing objects in a manufacturing system using the model of the object.

19. The method of claim 12, wherein the three-dimensional environment is selected from one of a virtual reality environment and an augmented reality environment.

20. The method of claim 12, wherein the display system is selected from at least one of a display device, a computer monitor, glasses, a head-mounted display device, a tablet computer, a mobile phone, a projector, a heads-up display, a holographic display system, or a virtual retinal display.

21. The method of claim 12, wherein the model is selected from one of a computer-aided design model, a finite element method model, and a computer-aided model.

22. The method of claim 12, wherein the interaction constitutes a design change in the model of the object if the interaction displaces a portion of the model of the object that is not designed to be movable.

* * * * *